US012696616B2

(12) United States Patent
Yamazaki et al.

(10) Patent No.: US 12,696,616 B2
(45) Date of Patent: Jul. 28, 2026

(54) DISPLAY APPARATUS, FABRICATION METHOD OF THE DISPLAY APPARATUS, DISPLAY MODULE, AND ELECTRONIC DEVICE

(71) Applicant: SEMICONDUCTOR ENERGY LABORATORY CO., LTD., Atsugi (JP)

(72) Inventors: Shunpei Yamazaki, Tokyo (JP); Kenichi Okazaki, Atsugi (JP); Yasumasa Yamane, Atsugi (JP); Ryota Hodo, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 415 days.

(21) Appl. No.: 18/276,604

(22) PCT Filed: Feb. 2, 2022

(86) PCT No.: PCT/IB2022/050878
§ 371 (c)(1),
(2) Date: Aug. 9, 2023

(87) PCT Pub. No.: WO2022/172128
PCT Pub. Date: Aug. 18, 2022

(65) Prior Publication Data
US 2024/0107845 A1      Mar. 28, 2024

(30) Foreign Application Priority Data
Feb. 12, 2021      (JP) ................................. 2021-020425

(51) Int. Cl.
*H10K 50/19*      (2023.01)
*H10K 59/35*      (2023.01)
(Continued)

(52) U.S. Cl.
CPC ........... *H10K 50/19* (2023.02); *H10K 59/352* (2023.02); *H10K 59/353* (2023.02); (Continued)

(58) Field of Classification Search
CPC .... H10K 50/19; H10K 59/352; H10K 59/353; H10K 71/233; H10K 71/60; (Continued)

(56) References Cited

U.S. PATENT DOCUMENTS 5,953,985 A      9/1999 Kobayashi
6,120,338 A      9/2000 Hirano et al.
(Continued)

FOREIGN PATENT DOCUMENTS

CN      001239395 A      12/1999
CN      107230692 A      10/2017
(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.
(Continued)

*Primary Examiner* — Donald L Raleigh
(74) *Attorney, Agent, or Firm* — Fish & Richardson P.C.

(57)      ABSTRACT

Provided is a high-resolution or high-definition display apparatus. The display apparatus includes a first light-emitting element, a second light-emitting element, and a sidewall. The first and second light-emitting elements each include a pixel electrode, a first light-emitting layer over the pixel electrode, an intermediate layer over the first light-emitting layer, a second light-emitting layer over the intermediate layer, and a common electrode over the second light-emitting layer. That is, the first and second light-emitting elements can have tandem structures. The pixel (Continued)

electrode, the first light-emitting layer, the intermediate layer, and the second light-emitting layer are separately provided between the light-emitting elements. The first light-emitting element and the second light-emitting element are adjacent to each other, and the sidewall is provided between the first light-emitting element and the second light-emitting element. The sidewall is provided to cover at least part of a side surface of the pixel electrode.

12 Claims, 24 Drawing Sheets

(51) Int. Cl.
| | | |
|---|---|---|
| *H10K 71/20* | (2023.01) | |
| *H10K 71/60* | (2023.01) | |
| *H10K 59/131* | (2023.01) | |

(52) U.S. Cl.
CPC ........... *H10K 71/233* (2023.02); *H10K 71/60* (2023.02); *H10K 59/131* (2023.02)

(58) Field of Classification Search
CPC ............. H10K 59/131; H10K 59/1201; H10K 59/122; H10K 71/231; H10K 71/621; H10K 59/351; H10K 59/38; H10K 59/121; H10K 50/17; H10K 59/124; H10K 59/32; G09F 9/33; H05B 33/10; H05B 33/14; H05B 33/22
See application file for complete search history.

(56) References Cited

U.S. PATENT DOCUMENTS

| | | | |
|---|---|---|---|
| 6,146,715 | A | 11/2000 | Kim et al. |
| 9,692,020 | B2 | 6/2017 | Park et al. |
| 10,096,776 | B2 | 10/2018 | Malinowski et al. |
| 10,468,637 | B2 | 11/2019 | Defranco et al. |
| 10,862,036 | B2 | 12/2020 | Ke et al. |
| 2002/0072139 | A1 | 6/2002 | Kashiwabara |
| 2005/0140275 | A1 | 6/2005 | Park |
| 2011/0148290 | A1 | 6/2011 | Oota |
| 2011/0198598 | A1 | 8/2011 | Kim et al. |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2015/0060826 | A1 | 3/2015 | Matsumoto. et al. |
| 2015/0069360 | A1 | 3/2015 | Sato |
| 2015/0076476 | A1 | 3/2015 | Odaka et al. |
| 2016/0172595 | A1 | 6/2016 | Malinowski et al. |
| 2016/0315133 | A1 | 10/2016 | Sato |
| 2017/0141167 | A1 | 5/2017 | Naganuma |
| 2017/0256754 | A1 | 9/2017 | Defranco et al. |
| 2017/0278910 | A1 | 9/2017 | Choi et al. |
| 2018/0145119 | A1 | 5/2018 | Choi et al. |
| 2018/0151830 | A1 | 5/2018 | Furuta et al. |
| 2018/0190908 | A1 | 7/2018 | Ke et al. |
| 2019/0165062 | A1 | 5/2019 | Heo |
| 2019/0172876 | A1 | 6/2019 | Xia |
| 2019/0181202 | A1 | 6/2019 | Lim et al. |
| 2020/0091464 | A1* | 3/2020 | Park .................... H10K 50/125 |
| 2020/0203662 | A1 | 6/2020 | Mollard et al. |
| 2021/0043705 | A1* | 2/2021 | Lim ..................... H10K 59/124 |
| 2021/0175468 | A1* | 6/2021 | Lee ........................ H10K 59/40 |
| 2023/0120428 | A1 | 4/2023 | Du et al. |

FOREIGN PATENT DOCUMENTS

| | | | |
|---|---|---|---|
| CN | 108123064 | A | 6/2018 |
| CN | 109904191 | A | 6/2019 |
| CN | 110010644 | A | 7/2019 |
| CN | 112349752 | A | 2/2021 |
| DE | 69834318 | | 4/2007 |
| DE | 102018129156 | | 6/2019 |
| DE | 102018131255 | | 6/2019 |
| EP | 0966182 | A | 12/1999 |
| GB | 2570399 | | 7/2019 |
| JP | 2000-012220 | A | 1/2000 |
| JP | 2000-036385 | A | 2/2000 |
| JP | 2003-059663 | A | 2/2003 |
| JP | 2008-098106 | A | 4/2008 |
| JP | 2008-147072 | A | 6/2008 |
| JP | 2008-251270 | A | 10/2008 |
| JP | 2012-160473 | A | 8/2012 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2018-092912 | A | 6/2018 |
| JP | 2019-179696 | A | 10/2019 |
| JP | 2020-160305 | A | 10/2020 |
| KR | 2000-0002154 | A | 1/2000 |
| KR | 2017-0113780 | A | 10/2017 |
| KR | 2018-0062362 | A | 6/2018 |
| KR | 2019-0064198 | A | 6/2019 |
| KR | 2019-0068814 | A | 6/2019 |
| KR | 2021-0017179 | A | 2/2021 |
| WO | WO-2018/087625 | | 5/2018 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19: SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

(56)                    References Cited

OTHER PUBLICATIONS

International Search Report (Application No. PCT/IB2022/050878) Dated Apr. 26, 2022.
Written Opinion (Application No. PCT/IB2022/050878) Dated Apr. 26, 2022.
European Search Report (Application No. 22752417.0) Dated Oct. 29, 2024.

\* cited by examiner

FIG. 2A
FIG. 2B
FIG. 2C
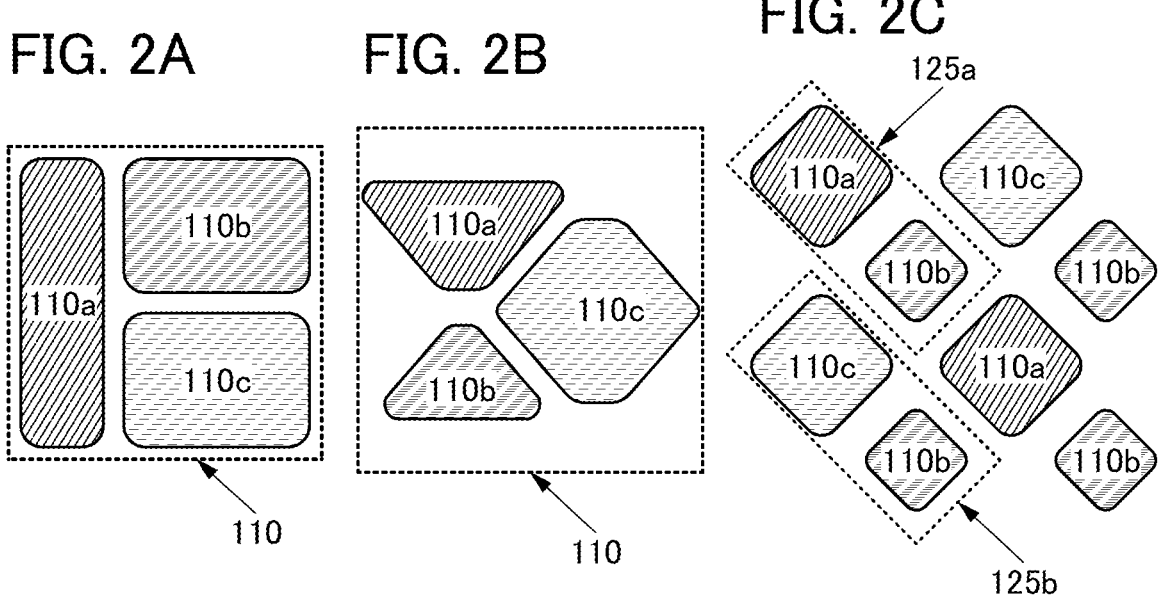
FIG. 2D
FIG. 2E
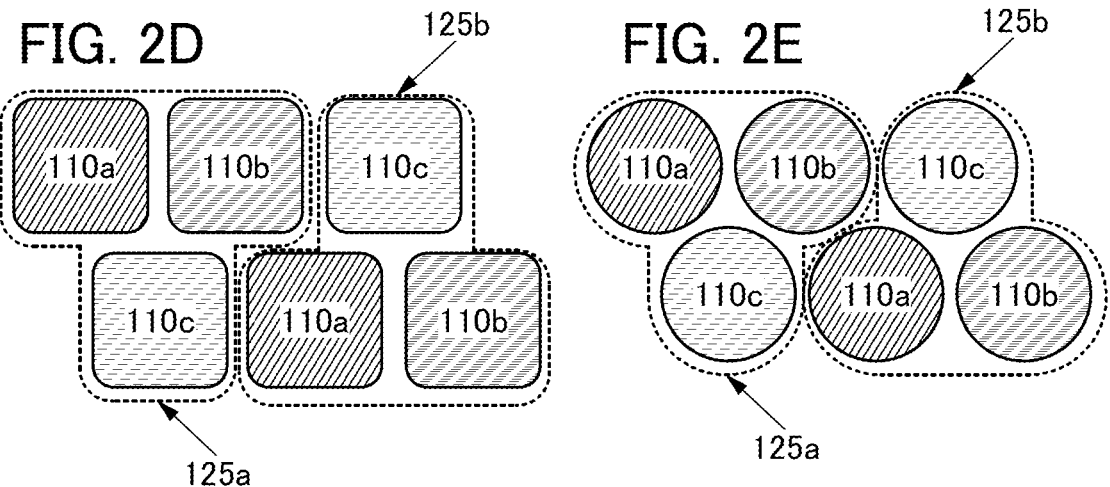

FIG. 7A                                          FIG. 7B
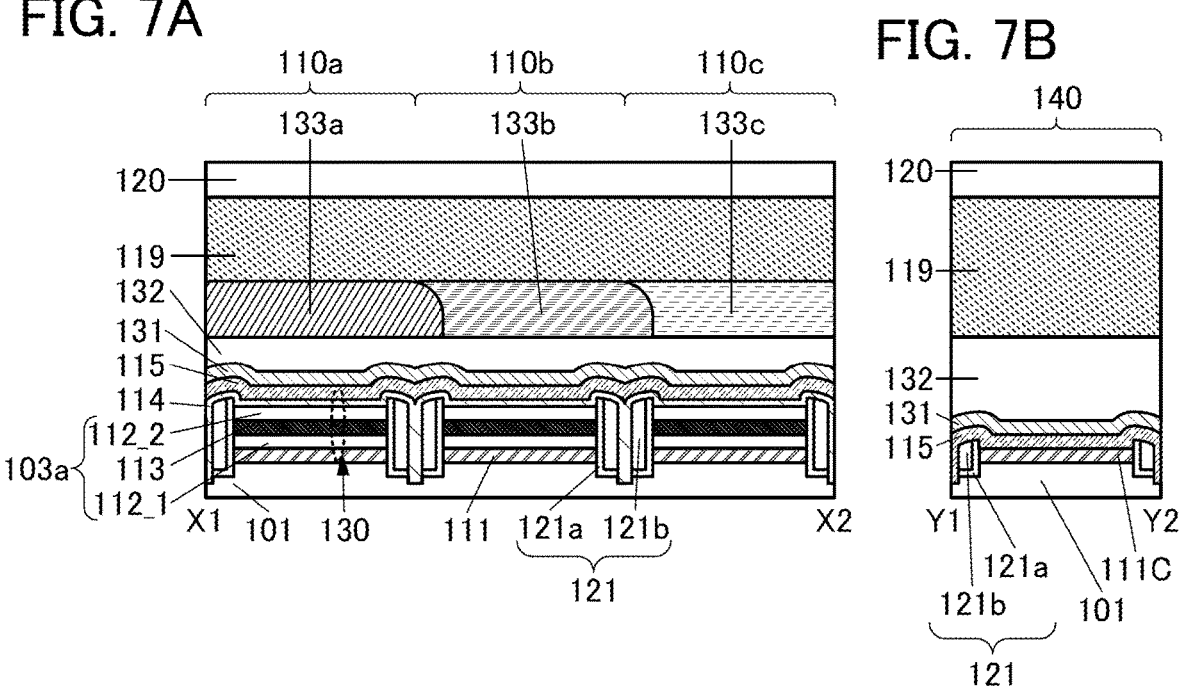

FIG. 20A
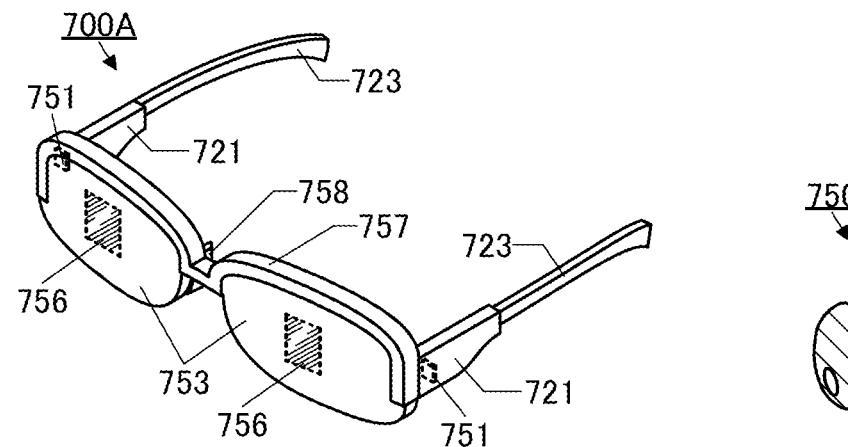
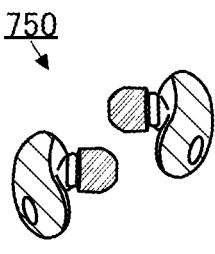
FIG. 20B
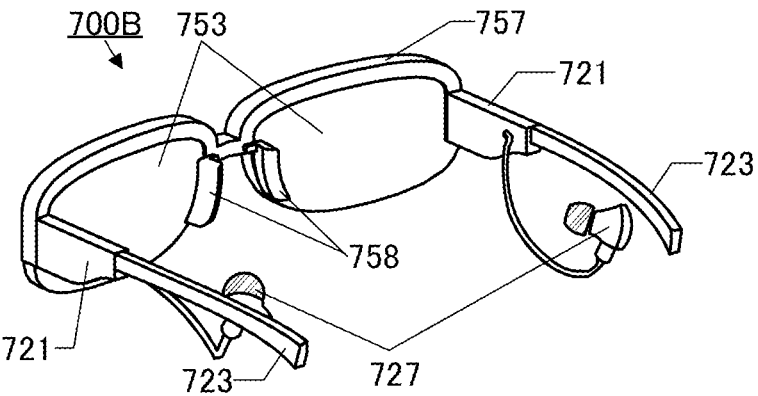

FIG. 21A
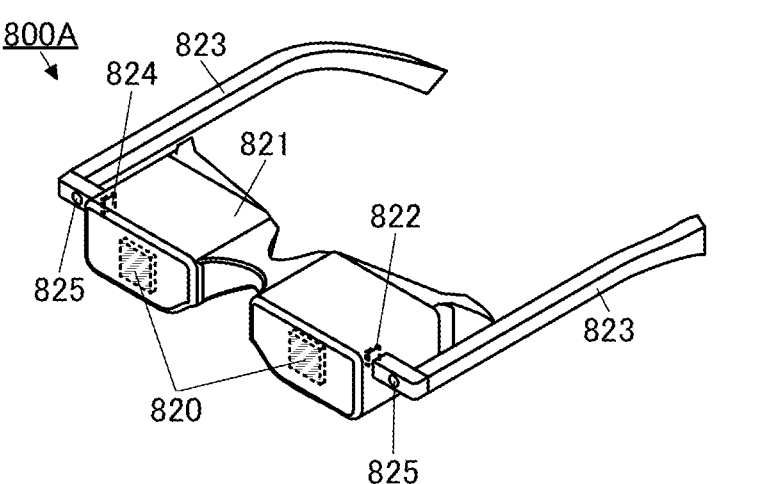
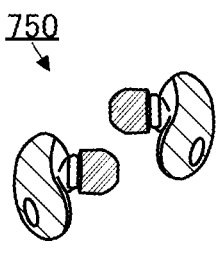
FIG. 21B
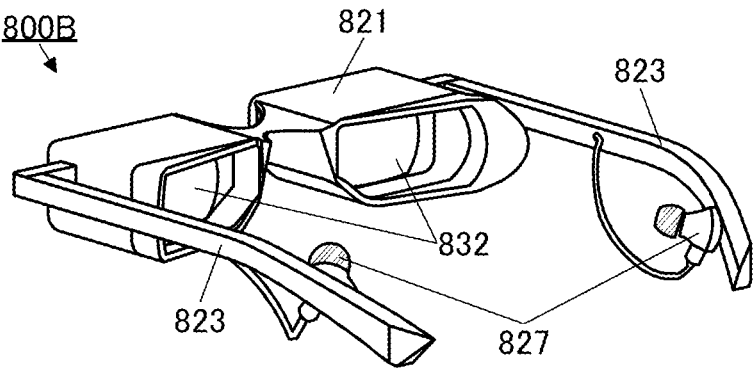

FIG. 23A
FIG. 23B
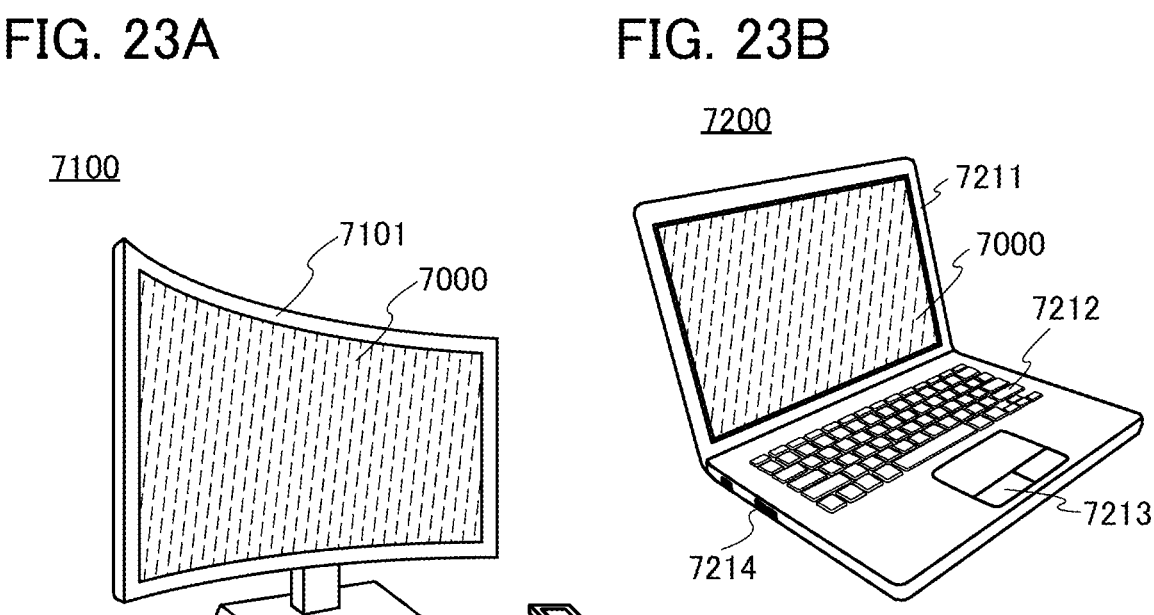
FIG. 23C
FIG. 23D
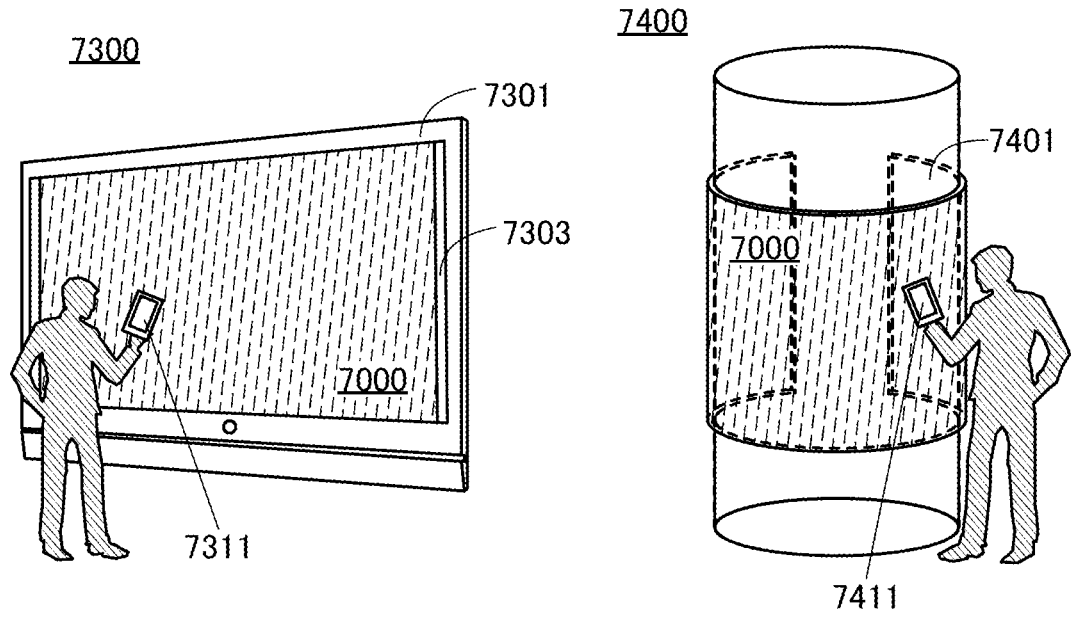

FIG. 24A
9101
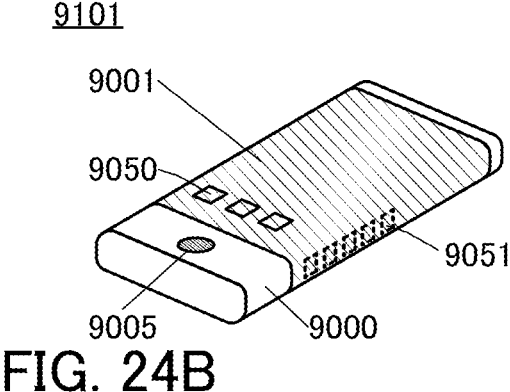
FIG. 24B
9102
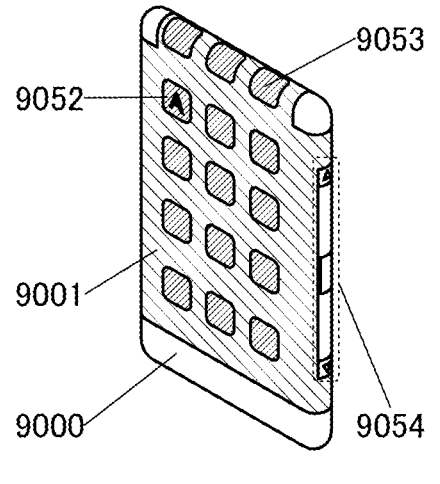
FIG. 24C
9200
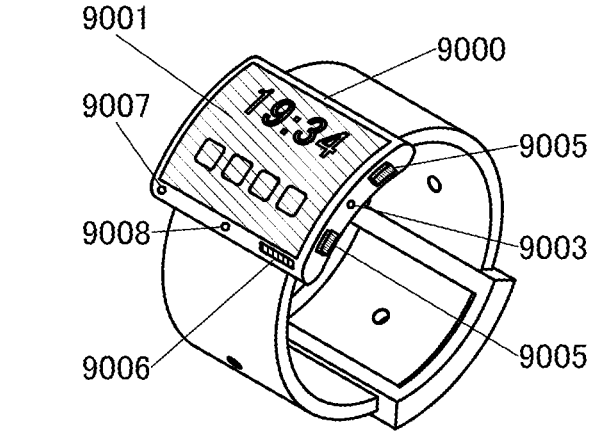
FIG. 24D
9201
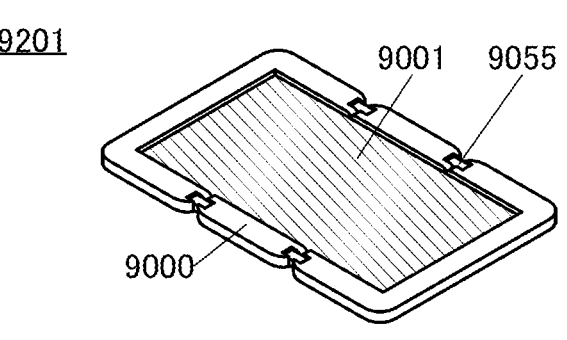
FIG. 24E
9201
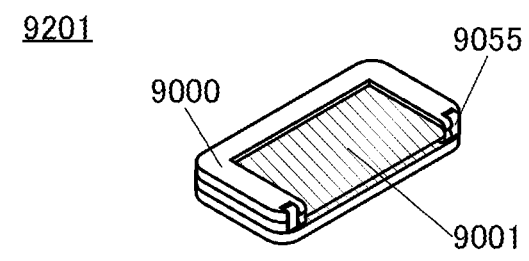
FIG. 24F
9201

DISPLAY APPARATUS, FABRICATION METHOD OF THE DISPLAY APPARATUS, DISPLAY MODULE, AND ELECTRONIC DEVICE

CROSS REFERENCE TO RELATED APPLICATIONS

This application is a U.S. National Phase Application under 35 U.S.C. § 371 of International Application PCT/IB2022/050878, filed on Feb. 2, 2022, which is incorporated by reference and claims the benefit of a foreign priority application filed in Japan on Feb. 12, 2021, as Application No. 2021-020425.

TECHNICAL FIELD

One embodiment of the present invention relates to a display apparatus and a fabrication method thereof. One embodiment of the present invention relates to a display module and an electronic device.

Note that one embodiment of the present invention is not limited to the above technical field. Examples of the technical field of one embodiment of the present invention include a semiconductor device, a display apparatus, a light-emitting apparatus, a power storage device, a memory device, an electronic device, a lighting device, an input device (e.g., a touch sensor), an input/output device (e.g., a touch panel), a method for driving any of them, and a method for fabricating any of them.

BACKGROUND ART

In recent years, display apparatuses have been expected to be applied to a variety of uses. Examples of uses for a large display apparatus include a television device for home use (also referred to as a TV or a television receiver), digital signage, and a PID (Public Information Display). In addition, a smartphone, a tablet terminal, and the like including a touch panel are being developed as portable information terminals.

Furthermore, higher resolution of display apparatuses have been required. For example, devices for virtual reality (VR), augmented reality (AR), substitutional reality (SR), or mixed reality (MR) are given as devices requiring high-resolution display apparatuses and have been actively developed.

Light-emitting apparatuses including light-emitting elements have been developed as display apparatuses, for example. Light-emitting elements (also referred to as light-emitting devices, EL elements, or EL devices) utilizing electroluminescence (hereinafter referred to as EL) have features such as ease of reduction in thickness and weight, high-speed response to input signals, and driving with a direct-current constant voltage source, and have been used in display apparatuses.

Patent Document 1 discloses a display apparatus using an organic EL element (also referred to as an organic EL device) for VR.

REFERENCE

Patent Document

[Patent Document 1] PCT International Publication No. 2018/087625

SUMMARY OF THE INVENTION

Problems to be Solved by the Invention

In the case of fabricating a display apparatus including a plurality of organic EL elements, light-emitting layers included in the organic EL elements are preferably formed in island shapes, in other words, the light-emitting layers are preferably separated between the organic EL elements. Accordingly, in the case where all of the organic EL elements emit light of the same color such as white light, for example, current can be inhibited from flowing between adjacent two light-emitting units through a layer shared by the adjacent two light-emitting units, e.g., any one or more layers of a hole-injection layer, a hole-transport layer, a light-emitting layer, an electron-transport layer, an electron-injection layer, and an intermediate layer (charge-generation layer). Thus, unintentional light emission (also referred to as crosstalk) from the organic EL elements can be inhibited. Consequently, the contrast of an image to be displayed on the display apparatus can be increased, enabling a display apparatus with high display quality.

In the case of forming a light-emitting layer in an island shape, a vacuum evaporation method using a metal mask (also referred to as a shadow mask) is used, for example. However, the outline of the layer may blur during vapor deposition, whereby the thickness of an end portion may be small. That is, the thickness of an island-shaped light-emitting layer may vary from area to area. In the case of fabricating a display apparatus with a large size, high definition, or high resolution, the yield might be reduced because of low dimensional accuracy of the metal mask and deformation due to heat or the like.

In the case where a display apparatus is fabricated with a vacuum evaporation method using a metal mask, an issue such as necessity of a plurality of manufacturing equipment lines arises. For example, since a metal mask has to be cleaned regularly, at least two or more manufacturing equipment lines need to be prepared, and one manufacturing equipment needs to be used for fabrication while the other manufacturing equipment is being under maintenance. In consideration of mass production, a plurality of manufacturing equipment lines are required. Thus, the issue is that the initial investment for introducing manufacturing equipment significantly increases.

An object of one embodiment of the present invention is to provide a high-resolution display apparatus. An object of one embodiment of the present invention is to provide a high-definition display apparatus. An object of one embodiment of the present invention is to provide a large display apparatus. An object of one embodiment of the present invention is to provide a highly reliable display apparatus. An object of one embodiment of the present invention is to provide an inexpensive display apparatus. An object of one embodiment of the present invention is to provide a novel display apparatus.

An object of one embodiment of the present invention is to provide a fabrication method of a high-resolution display apparatus. An object of one embodiment of the present invention is to provide a fabrication method of a high-definition display apparatus. An object of one embodiment of the present invention is to provide a fabrication method of a large display apparatus. An object of one embodiment of the present invention is to provide a fabrication method of a highly reliable display apparatus. An object of one embodiment of the present invention is to provide a fabrication method of a display apparatus with high yield. An object of one embodiment of the present invention is to provide a fabrication method of a novel display apparatus.

Note that the description of these objects does not preclude the existence of other objects. One embodiment of the present invention does not need to achieve all of these objects. Other objects can be derived from the description of the specification, the drawings, and the claims.

Means for Solving the Problems

One embodiment of the present invention is a display apparatus including a first light-emitting element, a second light-emitting element, a first sidewall, and a second sidewall. The first light-emitting element includes a first pixel electrode, a first light-emitting layer over the first pixel electrode, a first intermediate layer over the first light-emitting layer, a second light-emitting layer over the first intermediate layer, and a common electrode over the second light-emitting layer. The second light-emitting element includes a second pixel electrode, a third light-emitting layer over the second pixel electrode, a second intermediate layer over the third light-emitting layer, a fourth light-emitting layer over the second intermediate layer, and the common electrode over the fourth light-emitting layer. The first light-emitting element and the second light-emitting element are adjacent to each other. The first sidewall covers at least part of a side surface of the first pixel electrode. The second sidewall covers at least part of a side surface of the second pixel electrode.

In the above embodiment, there may be a gap between the first sidewall and the second sidewall.

Another embodiment of the present invention is a display apparatus including a first light-emitting element, a second light-emitting element, a first sidewall, a second sidewall, a third sidewall, and a fourth sidewall. The first light-emitting element includes a first pixel electrode, a first light-emitting layer over the first pixel electrode, a first intermediate layer over the first light-emitting layer, a second light-emitting layer over the first intermediate layer, and a common electrode over the second light-emitting layer. The second light-emitting element includes a second pixel electrode, a third light-emitting layer over the second pixel electrode, a second intermediate layer over the third light-emitting layer, a fourth light-emitting layer over the second intermediate layer, and the common electrode over the fourth light-emitting layer. The first light-emitting element and the second light-emitting element are adjacent to each other. The first sidewall covers at least part of a side surface of the first pixel electrode, parts of side surfaces of the first and second light-emitting layers, and part of a side surface of the first intermediate layer. The second sidewall covers at least part of a side surface of the first sidewall. The third sidewall covers at least part of a side surface of the second pixel electrode, parts of side surfaces of the third and fourth light-emitting layers, and part of a side surface of the second intermediate layer. The fourth sidewall covers at least part of a side surface of the third sidewall.

In the above embodiment, there may be a gap between the second sidewall and the fourth sidewall.

In the above embodiment, the second sidewall may cover at least part of a top surface of the first sidewall, and the fourth sidewall may cover at least part of a top surface of the third sidewall.

In the above embodiment, a protective layer may be included over the common electrode, a first coloring layer may be included over the protective layer so as to have a region overlapping with the first light-emitting layer and the second light-emitting layer, a second coloring layer may be included over the protective layer so as to have a region overlapping with the third light-emitting layer and the fourth light-emitting layer, the first coloring layer and the second coloring layer may have functions of transmitting light of different colors, the first light-emitting layer and the third light-emitting layer may have functions of emitting light of the same color, and the second light-emitting layer and the fourth light-emitting layer may have functions of emitting light of the same color.

In the above embodiment, a common layer may be included between the common electrode and the second and fourth light-emitting layers, and the common layer may function as one of an electron-injection layer and a hole-injection layer in the first and second light-emitting elements.

In the above embodiment, the first pixel electrode and the second pixel electrode may be provided over an insulating layer, the insulating layer may have a first projection in a region overlapping with the first pixel electrode, and the insulating layer may have a second projection in a region overlapping with the second pixel electrode.

A display module including the display apparatus of one embodiment of the present invention and at least one of a connector and an integrated circuit is also one embodiment of the present invention.

An electronic device including the display module of one embodiment of the present invention and at least one of a housing, a battery, a camera, a speaker, and a microphone is also one embodiment of the present invention.

Another embodiment of the present invention is a fabrication method of a display apparatus in which an insulating layer is formed; a conductive film, a first light-emitting film, an intermediate film, a second light-emitting film, and a sacrificial film are formed in this order over the insulating layer; the sacrificial film, the second light-emitting film, the intermediate film, the first light-emitting film, and the conductive film are etched to form a first pixel electrode and a second pixel electrode over the insulating layer, a first light-emitting layer over the first pixel electrode, a second light-emitting layer over the second pixel electrode, a first intermediate layer over the first light-emitting layer, a second intermediate layer over the second light-emitting layer, a third light-emitting layer over the first intermediate layer, a fourth light-emitting layer over the second intermediate layer, a first sacrificial layer over the third light-emitting layer, and a second sacrificial layer over the fourth light-emitting layer; an insulating film covering at least parts of side surfaces of the first and second pixel electrodes, parts of side surfaces of the first to fourth light-emitting layers, parts of side surfaces of the first and second intermediate layers, and parts of side surfaces and top surfaces of the first and second sacrificial layers is formed; the insulating film is etched to form a first sidewall covering at least part of the side surface of the first pixel electrode and a second sidewall covering at least part of the side surface of the second pixel electrode; the first sacrificial layer and the second sacrificial layer are removed; and a common electrode is formed over the third light-emitting layer and over the fourth light-emitting layer.

Another embodiment of the present invention is a fabrication method of a display apparatus in which an insulating layer is formed; a conductive film, a first light-emitting film, an intermediate film, a second light-emitting film, and a sacrificial film are formed in this order over the insulating layer; the sacrificial film, the second light-emitting film, the intermediate film, the first light-emitting film, and the conductive film are etched to form a first pixel electrode and a second pixel electrode over the insulating layer, a first light-emitting layer over the first pixel electrode, a second light-emitting layer over the second pixel electrode, a first intermediate layer over the first light-emitting layer, a second intermediate layer over the second light-emitting layer, a third light-emitting layer over the first intermediate layer, a fourth light-emitting layer over the second intermediate layer, a first sacrificial layer over the third light-emitting layer, and a second sacrificial layer over the fourth light-emitting layer; a first insulating film covering at least parts of side surfaces of the first and second pixel electrodes, parts of side surfaces of the first to fourth light-emitting layers, parts of side surfaces of the first and second intermediate layers, and parts of side surfaces and top surfaces of the first and second sacrificial layers is formed; a second insulating film is formed over the first insulating film; the first insulating film and the second insulating film are etched to form a first sidewall covering at least part of the side surface of the first pixel electrode, a second sidewall covering at least part of the side surface of the second pixel electrode, a third sidewall covering at least part of a side surface of the first sidewall, and a fourth sidewall covering at least part of a side surface of the second sidewall; the first sacrificial layer and the second sacrificial layer are removed; and a common electrode is formed over the third light-emitting layer and over the fourth light-emitting layer.

In the above embodiment, the conductive film may be etched using the first sacrificial layer and the second sacrificial layer as a mask.

In the above embodiment, a protective layer may be formed over the common electrode, a first coloring layer having a region overlapping with the first and third light-emitting layers and a second coloring layer having a region overlapping with the second and fourth light-emitting layers may be formed over the protective layer, and the first coloring layer and the second coloring layer may have functions of transmitting light of different colors.

In the above embodiment, after the first sacrificial layer and the second sacrificial layer are removed, a common layer functioning as one of an electron-injection layer and a hole-injection layer may be formed over the third light-emitting layer and over the fourth light-emitting layer, and the common electrode may be formed over the common layer.

In the above embodiment, a depression may be formed in the insulating layer in the etching step of the conductive film.

Effect of the Invention

With one embodiment of the present invention, a high-resolution display apparatus can be provided. With one embodiment of the present invention, a high-definition display apparatus can be provided. With one embodiment of the present invention, a large display apparatus can be provided. With one embodiment of the present invention, a highly reliable display apparatus can be provided. With one embodiment of the present invention, an inexpensive display apparatus can be provided. With one embodiment of the present invention, a novel display apparatus can be provided.

With one embodiment of the present invention, a fabrication method of a high-resolution display apparatus can be provided. With one embodiment of the present invention, a fabrication method of a high-definition display apparatus can be provided. With one embodiment of the present invention, a fabrication method of a large display apparatus can be provided. With one embodiment of the present invention, a fabrication method of a highly reliable display apparatus can be provided. With one embodiment of the present invention, a fabrication method of a display apparatus with high yield can be provided. With one embodiment of the present invention, a fabrication method of a novel display apparatus can be provided.

Note that the description of these effects does not preclude the existence of other effects. One embodiment of the present invention does not need to have all of these effects. Other effects can be derived from the description of the specification, the drawings, and the claims.

BRIEF DESCRIPTION OF THE DRAWINGS

FIG. 2A to FIG. 2E are top views illustrating structure examples of a display apparatus.

FIG. 7A and FIG. 7B are cross-sectional views illustrating a structure example of a display apparatus.

FIG. 18 is a cross-sectional view illustrating a structure example of a display apparatus.

FIG. 20A and FIG. 20B are diagrams illustrating examples of electronic devices.

FIG. 21A and FIG. 21B are diagrams illustrating examples of electronic devices.

FIG. 23A to FIG. 23D are diagrams illustrating examples of electronic devices.

FIG. 24A to FIG. 24F are diagrams illustrating examples of electronic devices.

MODE FOR CARRYING OUT THE INVENTION

Figure 1:
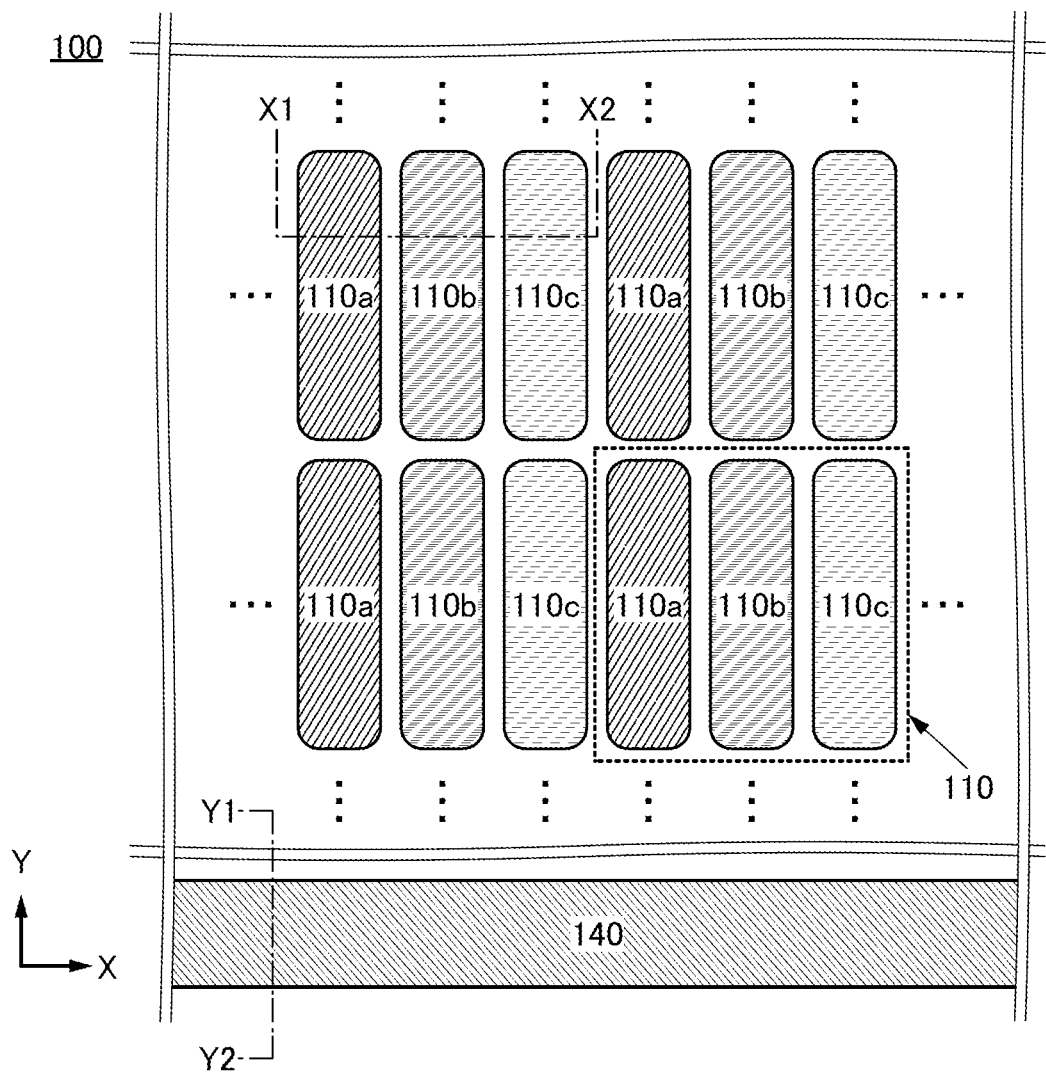
FIG. 1 is a top view illustrating a structure example of a display apparatus.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be replaced with the term "conductive film". As another example, the term "insulating film" can be replaced with the term "insulating layer".

In this specification and the like, a device fabricated using a metal mask or an FMM (a fine metal mask) is sometimes referred to as a device having an MM (metal mask) structure. In this specification and the like, a device fabricated without using a metal mask or an FMM is sometimes referred to as a device having an MML (metal maskless) structure.

Embodiment 1

In this embodiment, a display apparatus of one embodiment of the present invention and a fabrication method thereof will be described with reference to drawings.

In the fabrication method of the display apparatus of one embodiment of the present invention, first, a conductive film is formed over an insulating layer. Then, a first layer including a first light-emitting film is formed over the entire conductive film. Next, an intermediate film is formed over the first layer. Subsequently, a second layer including a second light-emitting film is formed over the entire intermediate film. After that, a sacrificial film is formed over the second layer.

Next, a resist mask is formed over the sacrificial film by a photolithography method or the like. After that, the sacrificial film, the second layer, the intermediate film, the first layer, and the conductive film are etched using the resist mask. Accordingly, a first pixel electrode over the insulating layer, a first light-emitting unit over the first pixel electrode, a first intermediate layer over the first light-emitting unit, a second light-emitting unit over the first intermediate layer, and a first sacrificial layer over the second light-emitting unit are formed in island shapes. In addition, a second pixel electrode over the insulating layer, a third light-emitting unit over the second pixel electrode, a second intermediate layer over the third light-emitting unit, a fourth light-emitting unit over the second intermediate layer, and a second sacrificial layer over the fourth light-emitting unit are formed in island shapes. The first to fourth light-emitting units include the first to fourth light-emitting layers, respectively.

As described above, in the fabrication method of the display apparatus of one embodiment of the present invention, the island-shaped light-emitting units and the like are formed not by using a pattern of a metal mask but by a photolithography method or the like. Accordingly, a high-resolution display apparatus or a display apparatus with a high aperture ratio, which has been difficult to be formed so far, can be obtained. Furthermore, since the light-emitting units can be formed in island shapes, a display apparatus with high contrast and high display quality can be obtained. Moreover, providing the sacrificial layers over the light-emitting units can reduce damage to the light-emitting units in the fabrication process of the display apparatus. Accordingly, a highly reliable display apparatus can be obtained.

Although it is difficult to set the distance between adjacent light-emitting elements to be less than 10 μm by a formation method using a metal mask, for example, the above method can shorten the distance to be less than or equal to 3 μm, less than or equal to 2 μm, or less than or equal to 1 μm.

A pattern of a light-emitting unit itself can be made extremely smaller than that in the case of using a metal mask. For example, in the case of using a metal mask for forming a light-emitting unit, a variation in the thickness of the pattern occurs between the center and the edge of the pattern; thus, an effective area that can be used as a light-emitting region with respect to the entire pattern area is reduced. By contrast, in the above fabrication method, a film formed to have a uniform thickness is etched, so that island-shaped light-emitting layers and the like can be formed to have uniform thicknesses. Accordingly, even with a fine pattern, almost the entire area can be used as a light-emitting region. Thus, a display apparatus having both a high resolution and a high aperture ratio can be fabricated.

As described above, a light-emitting element in the display apparatus of one embodiment of the present invention has a structure in which two or more light-emitting units are stacked with an intermediate layer provided therebetween. That is, the light-emitting element included in the display apparatus of one embodiment of the present invention can have a tandem structure. When the colors of light emitted from two light-emitting units stacked in a light-emitting element having a tandem structure are complementary to each other, for example, the light-emitting element can emit white light. Thus, providing a coloring layer in a region overlapping with the light-emitting element enables full-color display in the display apparatus of one embodiment of the present invention, for example.

Here, each of the first to fourth light-emitting units includes at least a light-emitting layer and preferably consists of a plurality of layers. Specifically, one or more layers are preferably provided over the light-emitting layer. Providing a layer between the light-emitting layer and the sacrificial layer can inhibit the light-emitting layer from being exposed on the outermost surface during the fabrication process of the display apparatus and can reduce damage to the light-emitting layer. Thus, the reliability of the light-emitting element can be increased. For example, each of the first to fourth light-emitting units preferably includes a carrier-transport layer over the light-emitting layer in addition to the light-emitting layer.

Note that it is not necessary to form all layers included in the light-emitting element in island shapes. In the fabrication method of the display apparatus of one embodiment of the present invention, after some of the layers included in the light-emitting element are formed in island shapes, the sacrifice layer is removed and the rest of the layers included in the light-emitting element and a common electrode (also referred to as an upper electrode) are formed so as to be shared by light-emitting elements. For example, a carrier-injection layer and the common electrode can be formed so as to be shared by the light-emitting elements.

The carrier-injection layer is often a layer having relatively high conductivity in the light-emitting element. Thus, when the carrier-injection layer is in contact with a side surface of a layer formed in an island shape, the light-emitting element might be short-circuited. Note that also in the case where the carrier-injection layer is formed in an island shape and the common electrode is formed to be shared by the light-emitting elements, the light-emitting elements might be short-circuited when the common electrode is in contact with a side surface of the light-emitting unit or a side surface of the pixel electrode.

Hence, in the display apparatus of one embodiment of the present invention, a sidewall (also referred to as a sidewall protective layer, a sidewall insulating film, an insulating layer, or the like) that covers a side surface of a layer formed in an island shape is provided.

Accordingly, the layer formed in an island shape can be inhibited from being in contact with the carrier-injection layer or the common electrode. Thus, a short circuit in the light-emitting element can be inhibited, leading to an increase in the reliability of the light-emitting element.

[Structure Example of Display Apparatus]

FIG. 1 is a top view illustrating a structure example of a display apparatus 100, which is a display apparatus of one embodiment of the present invention. The display apparatus 100 includes a display portion in which a plurality of pixels 110 are arranged in a matrix, and a connection portion 140 outside the display portion. One pixel 110 consists of three subpixels: a subpixel 110a, a subpixel 110b, and a subpixel 110c.

FIG. 1 illustrates an example where subpixels of different colors are arranged in the X direction and subpixels of the same color are arranged in the Y direction. Note that subpixels of different colors may be arranged in the Y direction, and subpixels of the same color may be arranged in the X direction.

Although FIG. 1 illustrates an example where the connection portion 140 is positioned on the lower side of the display portion in the top view, one embodiment of the present invention is not particularly limited. The connection portion 140 is provided in at least one of the upper side, the right side, the left side, and the lower side of the display portion in the top view, or may be provided so as to surround the four sides of the display portion. The number of the connection portions 140 can be one or more.

In the display apparatus 100 illustrated in FIG. 1, stripe arrangement is employed as the arrangement of the subpixel 110a, the subpixel 110b, and the subpixel 110c. Here, the arrangement of the subpixels is not limited to stripe arrangement. For example, S-stripe arrangement, matrix arrangement, delta arrangement, Bayer arrangement, or PenTile arrangement can be employed.

Examples of a top surface shape of the subpixel include polygons such as a triangle, a tetragon (including a rectangle and a square), and a pentagon; polygons with rounded corners; an ellipse; and a circle. Here, a top surface shape of the subpixel corresponds to a top surface shape of a light-emitting region of a light-emitting element.

FIG. 2A to FIG. 2C are top views illustrating structure examples of the pixel 110, and are modification examples of the pixel 110 illustrated in FIG. 1. The pixel 110 illustrated in FIG. 2A employs S-stripe arrangement. The pixel 110 illustrated in FIG. 2A consists of three subpixels: the subpixel 110a, the subpixel 110b, and the subpixel 110c. The subpixel 110a may be a blue subpixel, the subpixel 110b may be a red subpixel, and the subpixel 110c may be a green subpixel, for example.

The pixel 110 illustrated in FIG. 2B includes the subpixel 110a whose top surface shape is a rough trapezoid with rounded corners, the subpixel 110b whose top surface shape is a rough triangle with rounded corners, and the subpixel 110c whose top surface shape is a rough tetragon or rough hexagon with rounded corners. The subpixel 110a has a larger light-emitting area than the subpixel 110b. In this manner, the shapes and sizes of the subpixels can be determined independently. For example, the size of a subpixel including a light-emitting element with higher reliability can be smaller. The subpixel 110a may be a green subpixel, the subpixel 110b may be a red subpixel, and the subpixel 110c may be a blue subpixel, for example.

A pixel 125a and a pixel 125b illustrated in FIG. 2C employ PenTile arrangement. FIG. 2C illustrates an example where the pixels 125a including the subpixel 110a and the subpixel 110b and the pixels 125b including the subpixel 110b and the subpixel 110c are alternately arranged. The subpixel 110a may be a blue subpixel, the subpixel 110b may be a green subpixel, and the subpixel 110c may be a red subpixel, for example.

FIG. 2D and FIG. 2E are top views illustrating structure examples of the pixel 125a and the pixel 125b. The display apparatus 100 may have a structure in which a plurality of the pixels 125a and the pixels 125b are arranged in a matrix instead of the pixels 110.

The pixel 125a and the pixel 125b illustrated in FIG. 2D and FIG. 2E employ delta arrangement. The pixel 125a includes two subpixels (the subpixel 110a and the subpixel 110b) in the upper row (first row) and one subpixel (the subpixel 110c) in the lower row (second row). The pixel 125b includes one subpixel (the subpixel 110c) in the upper row (first row) and two subpixels (the subpixel 110a and the subpixel 110b) in the lower row (second row).

FIG. 2D illustrates an example where a top surface shape of each subpixel is a rough tetragon with rounded corners, and FIG. 2E illustrates an example where a top surface shape of each subpixel is a circle.

In a photolithography method, as a pattern to be etched becomes finer, the influence of light diffraction becomes more difficult to ignore; thus, the fidelity in transferring a photomask pattern by light exposure is degraded, and it becomes difficult to etch a resist mask into a desired shape. Thus, a pattern with rounded corners is likely to be formed even with a rectangular photomask pattern. Consequently, a top surface shape of a subpixel becomes a polygon with rounded corners, an ellipse, a circle, or the like, in some cases.

Furthermore, in the fabrication method of the display apparatus of one embodiment of the present invention, the light-emitting unit or the like including the light-emitting layer is etched to have an island shape using a resist mask. A resist film formed over the light-emitting unit needs to be cured at a temperature lower than the upper temperature limit of the light-emitting unit or the like. Thus, the resist film is insufficiently cured in some cases depending on the upper temperature limit of the material of the light-emitting unit or the like and the curing temperature of the resist material. An insufficiently cured resist film may have a shape different from a desired shape at the time of etching. As a result, a top surface shape of the light-emitting unit or the like becomes a polygon with rounded corners, an ellipse, a circle, or the like, in some cases. For example, when a resist mask whose top surface shape is a square is intended to be formed, a resist mask whose top surface shape is a circle may be formed, and the top surface shape of the light-emitting unit or the like may be a circle.

To obtain a desired top surface shape of the light-emitting unit or the like, a technique of correcting a mask pattern in advance so that a transferred pattern agrees with a design pattern (an OPC (Optical Proximity Correction) technique) may be used. Specifically, with the OPC technique, a pattern for correction is added to a corner portion or the like of a figure on a mask pattern.

The display apparatus of one embodiment of the present invention can have any of the following structures: a top-emission structure in which light is emitted in a direction opposite to a substrate where a light-emitting element is formed, a bottom-emission structure in which light is emitted toward a substrate where a light-emitting element is formed, and a dual-emission structure in which light is emitted toward both surfaces.

Figures 3A, 3B, 3C:
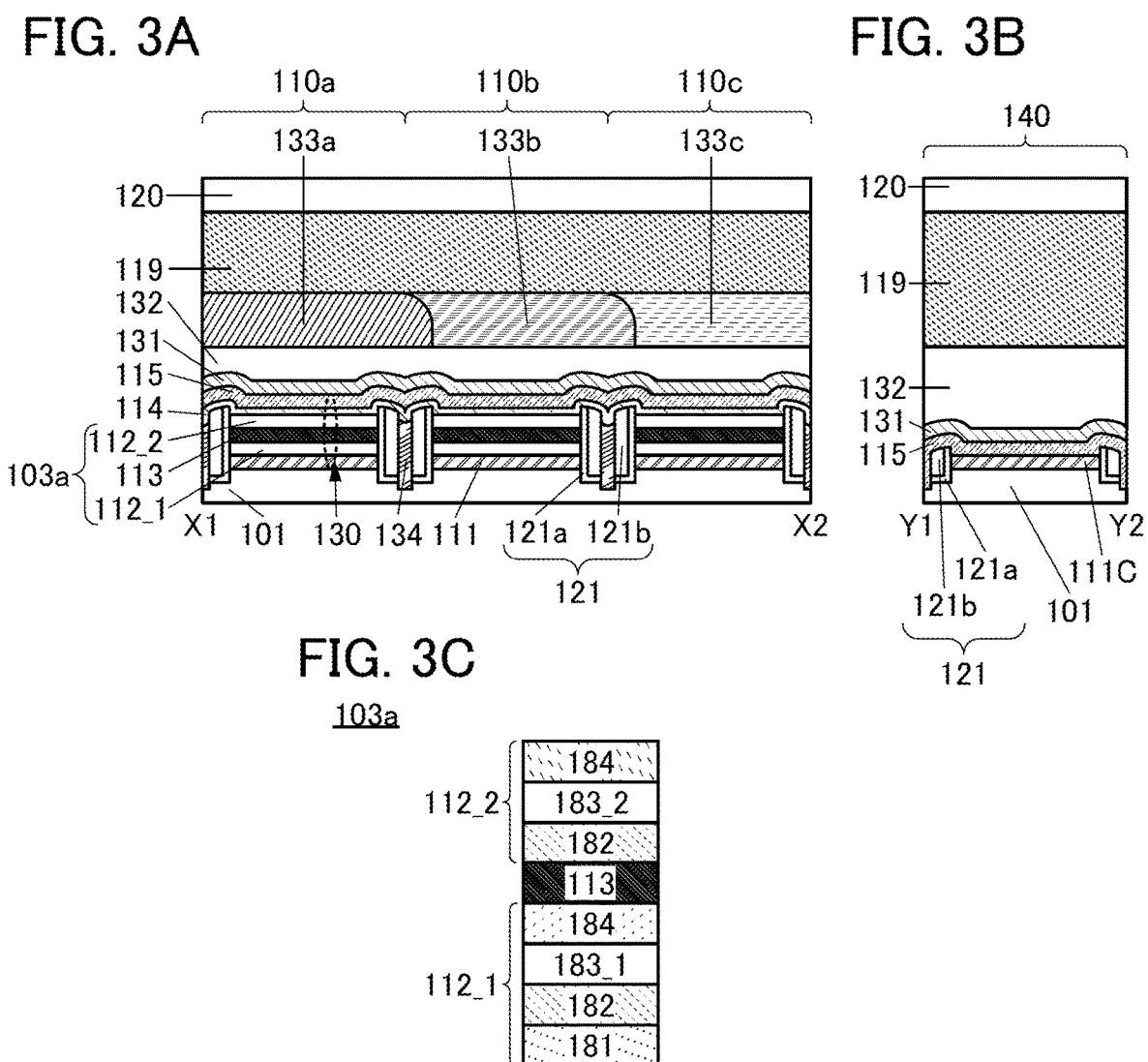
FIG. 3A and FIG. 3B are cross-sectional views illustrating a structure example of a display apparatus.
FIG. 3C is a cross-sectional view illustrating a structure example of a light-emitting unit.

FIG. 3A is a cross-sectional view illustrating a structure example along dashed-dotted line X1-X2 in FIG. 1.

As illustrated in FIG. 3A, in the display apparatus 100, light-emitting elements 130 are provided over a layer 101 including a transistor, and a protective layer 131 and a protective layer 132 are provided to cover these light-emitting elements. Coloring layers 133 (a coloring layer 133a, a coloring layer 133b, and a coloring layer 133c) are provided over the protective layer 132. A substrate 120 is bonded onto the coloring layer 133 with a resin layer 119. Furthermore, a sidewall 121 is provided in a region between adjacent light-emitting elements 130.

The layer 101 including a transistor can employ a stacked-layer structure in which a plurality of transistors are provided over a substrate and an insulating layer is provided to cover these transistors, for example. The layer 101 including a transistor may have a depression between adjacent light-emitting elements 130. In other words, the layer 101 including a transistor may have a projection in a region overlapping with the light-emitting element 130. For example, the depression and the projection may be provided in an insulating layer positioned at the outermost surface of the layer 101 including a transistor. A structure example of the layer 101 including a transistor will be described in Embodiment 2.

The light-emitting element 130 has a function of emitting white light, for example. In this specification and the like, a light-emitting element having a function of emitting white light is referred to as a white light-emitting element in some cases. A combination of a display apparatus including a white light-emitting element with coloring layers (also referred to as color filters) enables full-color display.

The light-emitting element 130 includes a light-emitting unit between a pair of electrodes. In this specification and the like, one of the pair of electrodes may be referred to as a pixel electrode and the other may be referred to as a common electrode.

One electrode of the pair of electrodes included in the light-emitting element functions as an anode, and the other electrode functions as a cathode. Hereinafter, unless otherwise specified, the case where the pixel electrode functions as an anode and the common electrode functions as a cathode is described as an example.

The light-emitting element 130 includes a pixel electrode 111 over the layer 101 including a transistor, a light-emitting unit 112_1 over the pixel electrode 111, an intermediate layer 113 over the light-emitting unit 112_1, a light-emitting unit 112_2 over the intermediate layer 113, a common layer 114 over the light-emitting unit 112_2, and a common electrode 115 over the common layer 114. Here, the common layer 114 can include a layer containing a material having a high electron-injection property (an electron-injection layer), for example. Note that in the case where the pixel electrode 111 functions as a cathode and the common electrode 115 functions as an anode, the common layer 114 can include a hole-injection layer, for example.

The pixel electrode 111, the light-emitting units 112, and the intermediate layer 113 are formed in island shapes in each of the light-emitting elements 130. That is, the pixel electrode 111, the light-emitting units 112, and the intermediate layer 113 are separately provided between the light-emitting elements 130. Formation of the pixel electrode 111 or the like can provide the layer 101 including a transistor with a projection in a region overlapping with the pixel electrode 111. Note that the light-emitting unit 112_1, the intermediate layer 113, and the light-emitting unit 112_2 can be collectively referred to as a layer 103a.

In this specification and the like, signs such as _1 and _2 are used to distinguish different light-emitting units 112 from each other. The same applies to other components in some cases.

A conductive film that transmits visible light is used as the electrode through which light is extracted among the pixel electrode 111 and the common electrode 115. A conductive film that reflects visible light is preferably used as the electrode through which light is not extracted.

As a material that forms the pair of electrodes (the pixel electrode 111 and the common electrode 115) of the light-emitting element 130, a metal, an alloy, an electrically conductive compound, a mixture thereof, and the like can be used as appropriate. Specific examples include an indium tin oxide (also referred to as an In—Sn oxide or ITO), an In—Si—Sn oxide (also referred to as ITSO), an indium zinc oxide (In—Zn oxide), an In—W—Zn oxide, an alloy containing aluminum (an aluminum alloy) such as an alloy of aluminum, nickel, and lanthanum (Al—Ni—La), and an alloy of silver, palladium, and copper (Ag—Pd—Cu, also referred to as APC). In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) and an alloy containing an appropriate combination of any of these metals. It is also possible to use an element belonging to Group 1 or Group 2 of the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these, graphene, or the like.

The light-emitting element 130 preferably employs a microcavity structure. Therefore, one of the pair of electrodes of the light-emitting element 130 is preferably an electrode having properties of transmitting and reflecting visible light (a semi-transmissive and semi-reflective electrode), and the other is preferably an electrode having a property of reflecting visible light (a reflective electrode).

When the light-emitting element 130 has a microcavity structure, light obtained from the light-emitting unit 112 can be resonated between the electrodes, whereby light emitted from the light-emitting element 130 can be intensified.

Note that the semi-transmissive and semi-reflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light with a wavelength greater than or equal to 400 nm and less than 750 nm) transmittance higher than or equal to 40% is preferably used in the light-emitting element 130. The semi-transmissive and semi-reflective electrode has a visible light reflectance of higher than or equal to 10% and lower than or equal to 95%, preferably higher than or equal to 30% and lower than or equal to 80%. The reflective electrode has a visible light reflectance of higher than or equal to 40% and lower than or equal to 100%, preferably higher than or equal to 70% and lower than or equal to 100%. These electrodes preferably have a resistivity lower than or equal to $1 \times 10^{-2}$ $\Omega$cm.

FIG. 3B is a cross-sectional view illustrating the structure example along dashed-dotted line Y1-Y2 in FIG. 1, and is a cross-sectional view illustrating a structure example of the connection portion 140. The connection portion 140 includes a connection electrode 111C over the layer 101 including a transistor, the common electrode 115 over the connection electrode 111C, the protective layer 131 over the common electrode 115, the protective layer 132 over the protective layer 131, the resin layer 119 over the protective layer 132, and the substrate 120 over the resin layer 119. The connection electrode 111C is electrically connected to the common electrode 115.

FIG. 3C is a cross-sectional view illustrating a detailed structure example of the layer 103a. The light-emitting unit 112_1 includes, for example, a layer 181, a layer 182 over the layer 181, a light-emitting layer 183_1 over the layer 182, and a layer 184 over the light-emitting layer 183_1. The light-emitting unit 112_2 includes, for example, the layer 182 over the intermediate layer 113, a light-emitting layer 183_2 over the layer 182, and the layer 184 over the light-emitting layer 183_2.

The layer 181 includes, for example, a layer containing a substance having a high hole-injection property (a hole-injection layer). The layer 182 includes, for example, a layer containing a substance having a high hole-transport property (a hole-transport layer). The layer 184 includes, for example, a layer containing a substance having a high electron-transport property (an electron-transport layer). Here, in the case where the pixel electrode 111 functions as a cathode and the common electrode 115 functions as an anode, the layer 181 includes an electron-injection layer or the like. Furthermore, the layer 182 includes an electron-transport layer or the like. In addition, the layer 184 includes a hole-transport layer or the like. Note that the light-emitting unit 112 may include a layer containing a substance having a high hole-blocking property (a hole-blocking layer), or may include a layer containing a substance having a high electron-blocking property (an electron-blocking layer).

Note that the layer 182, the layer 184, and the like may have the same structure (material, thickness, or the like) or different structures between the light-emitting unit 112_1 and the light-emitting unit 112_2, for example.

Note that although FIG. 3C illustrates the layer 181 and the layer 182 separately, one embodiment of the present invention is not limited thereto. For example, the layer 182 may be omitted in the case where the layer 181 has functions of both a hole-injection layer and a hole-transport layer or in the case where the layer 181 has functions of both an electron-injection layer and an electron-transport layer.

Providing the layer 184 over the light-emitting layer 183_2 can inhibit the light-emitting layer 183 from being exposed on the outermost surface during the fabrication process of the display apparatus 100 and can reduce damage to the light-emitting layer 183. Thus, the reliability of the light-emitting element 130 can be increased.

The intermediate layer 113 has a function of injecting electrons into one of the light-emitting unit 112_1 and the light-emitting unit 112_2 and injecting holes to the other when voltage is applied between the pixel electrode 111 and the common electrode 115. The intermediate layer 113 can also be referred to as a charge-generation layer.

The color of light emitted from the light-emitting layer 183_1 and the color of light emitted from the light-emitting layer 183_2 can be complementary to each other, for example. In that case, the light-emitting element 130 as a whole can emit white light. For example, one of the light-emitting layer 183_1 and the light-emitting layer 183_2 can emit red light and green light, and the other of the light-emitting layer 183_1 and the light-emitting layer 183_2 can emit blue light. Alternatively, one of the light-emitting layer 183_1 and the light-emitting layer 183_2 can emit yellow light or orange light, and the other of the light-emitting layer 183_1 and the light-emitting layer 183_2 can emit blue light. In the case where one light-emitting layer 183 emits light of two or more colors, the light-emitting layer 183 can have a stacked-layer structure of two or more layers. For example, in the case where one light-emitting layer 183 emits red light and green light, the light-emitting layer 183 can have a stacked-layer structure including a layer that emits red light and a layer that emits green light.

A structure where a plurality of the light-emitting units 112 are stacked with the intermediate layer 113 provided therebetween as in the light-emitting element 130 is referred to as a tandem structure in this specification. Meanwhile, a structure including one light-emitting unit 112 between a pair of electrodes is referred to as a single structure. Note that a tandem structure can also be referred to as a stack structure, for example. When a light-emitting element has a tandem structure, a light-emitting element capable of emitting light with high luminance can be obtained. Furthermore, a tandem structure allows current needed for obtaining the same luminance to be reduced as compared to the case of using a single structure; thus, the power consumption of a display apparatus can be reduced and the reliability of a light-emitting element can be increased.

A structure in which light-emitting layers are separated between light-emitting elements as in the light-emitting elements 130 is referred to as an SBS (Side By Side) structure in some cases. The SBS structure can optimize materials and structures of light-emitting elements and thus can extend freedom of choice of materials and structures, whereby the luminance and the reliability of the light-emitting elements can be easily improved.

It can be said that the light-emitting element 130 has a tandem structure and an SBS structure. Thus, the light-emitting element 130 can have advantages of both of a tandem structure and an SBS structure. Note that the display apparatus 100 has a structure in which two light-emitting units 112 are formed in series as illustrated in FIG. 3A; thus, such a structure can be referred to as a two-unit tandem structure.

Here, the light-emitting element 130 is described as a white light-emitting element. That is, the color emitted from the light-emitting element 130 is not changed depending on the color exhibited by a subpixel. Thus, the color emitted from the light-emitting layer 183 does not need to be different between the light-emitting elements 130. Accordingly, all of the light-emitting layers 183 included in the light-emitting elements 130 can be collectively formed, for example. Hence, the display apparatus 100 can be fabricated at low cost and the yield can be improved as compared to the case where the color emitted from the light-emitting layer 183 is changed depending on the color exhibited by a subpixel. Thus, the cost of the display apparatus 100 can be reduced.

Specific examples of the layers in the light-emitting element 130 will be described below.

The hole-injection layer is a layer injecting holes from an anode to a hole-transport layer, and a layer containing a material with a high hole-injection property. Examples of the material with a high hole-injection property include an aromatic amine compound and a composite material containing a hole-transport material and an acceptor material (electron-accepting material).

The hole-transport layer is a layer transporting holes, which are injected from an anode by a hole-injection layer, to a light-emitting layer. The hole-transport layer is a layer containing a hole-transport material. As the hole-transport material, a substance having a hole mobility greater than or equal to $1\times10^{-6}$ cm$^2$/Vs is preferable. Note that other substances can also be used as long as they have a property of transporting more holes than electrons. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferable.

The electron-transport layer is a layer that transports electrons, which are injected from a cathode by an electron-injection layer, to a light-emitting layer. The electron-transport layer is a layer containing an electron-transport material. As the electron-transport material, a substance having an electron mobility greater than or equal to $1\times10^{-6}$ cm$^2$/Vs is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer injecting electrons from a cathode to the electron-transport layer, and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

For the electron-injection layer, for example, an alkali metal, an alkaline earth metal, or a compound thereof, such as lithium, cesium, ytterbium, lithium fluoride (LiF), cesium fluoride (CsF), calcium fluoride (CaF$_X$, where X is a given number), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide (LiO$_x$), or cesium carbonate can be used. The electron-injection layer may have a stacked-layer structure of two or more layers. The stacked-layer structure can be, for example, a structure in which lithium fluoride is used for the first layer and ytterbium is provided for the second layer.

Alternatively, as the above-described electron-injection layer, an electron-transport material may be used. For example, a compound having an unshared electron pair and having an electron deficient heteroaromatic ring skeleton can be used as the material having an electron-transport property. Specifically, a compound with at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino[2,3-a:2',3'-c]phenazine (abbreviation: HATNA), or 2,4,6-tris[3'-(pyridin-3-yl)biphenyl-3-yl]-1,3,5-triazine (abbreviation: TmPPPyTz) can be used as the organic compound having an unshared electron pair. Note that NBPhen has a higher glass transition point (Tg) than BPhen and thus has high heat resistance.

The light-emitting layer is a layer containing a light-emitting substance. The light-emitting layer can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (a guest material). As one or more kinds of organic compounds, one or both of the hole-transport material and the electron-transport material can be used. Alternatively, as one or more kinds of organic compounds, a bipolar material or a TADF material may be used.

The light-emitting layer preferably includes, for example, a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be smoothly transferred and light emission can be efficiently obtained. With this structure, high efficiency, low-voltage driving, and a long lifetime of the light-emitting element can be achieved at the same time.

For the intermediate layer, for example, a material that can be used for the electron-injection layer, such as lithium, can be suitably used. For the intermediate layer, for example, a material that can be used for the hole-injection layer can be suitably used. For the intermediate layer, a layer containing a hole-transport material and an acceptor material (electron-accepting material) can be used. For the intermediate layer, a layer containing an electron-transport material and a donor material can be used. Forming the intermediate layer including such a layer can suppress an increase in the driving voltage that would be caused when the light-emitting units are stacked.

At least part of a side surface of the pixel electrode 111 is covered with the sidewall 121. Thus, the common layer 114 can be inhibited from being in contact with the side surface of the pixel electrode 111. At least part of a side surface of the light-emitting unit 112 and part of a side surface of the intermediate layer 113 may be covered with the sidewall 121. In that case, the common layer 114 can be inhibited from being in contact with the side surface of any of the light-emitting unit 112 and the intermediate layer 113. Accordingly, a short circuit in the light-emitting element 130 can be inhibited.

FIG. 3A and FIG. 3B illustrate an example in which the sidewall 121 has a two-layer structure of a sidewall 121a and a sidewall 121b. The thickness of the sidewall 121b in the X direction and the thickness of the sidewall 121b in the Y direction can be larger than the thickness of the sidewall 121a in the X direction and the thickness of the sidewall 121a in the Y direction, respectively. An end portion of the sidewall 121b can have a rounded shape. The end portion of the sidewall 121b preferably has a rounded shape because the coverage with the common layer 114, the common electrode 115, and the protective layer 131 is increased.

The sidewall 121a covers at least part of the side surface of the pixel electrode 111. The sidewall 121a may cover at least part of the side surface of the light-emitting unit 112 and part of the side surface of the intermediate layer 113. The sidewall 121b covers at least part of a side surface of the sidewall 121a and part of the top surface of the sidewall 121a.

For each of the sidewall 121a and the sidewall 121b, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film.

The sidewall 121a and the sidewall 121b can be formed by any of a variety of film formation methods such as a sputtering method, an evaporation method, a chemical vapor deposition (CVD) method, and an atomic layer deposition (ALD) method, for example. In particular, an ALD method gives less deposition damage to a layer where a film is to be formed; for this reason, the sidewall 121a, which is directly formed on the light-emitting unit 112 and the intermediate layer 113, is preferably formed by an ALD method. In that case, the sidewall 121b is preferably formed by a sputtering method because the productivity can be increased.

An aluminum oxide film formed by an ALD method can be used as the sidewall 121a, and a silicon nitride film formed by a sputtering method can be used as the sidewall 121b, for example.

It is preferred that one or both of the sidewall 121a and the sidewall 121b function as a barrier insulating film against at least one of water and oxygen. Alternatively, it preferred that one or both of the sidewall 121a and the sidewall 121b have a function of inhibiting diffusion of at least one of water and oxygen. Alternatively, it preferred that one or both of the sidewall 121a and the sidewall 121b have a function of capturing or fixing (also referred to as gettering) at least one of water and oxygen.

Note that in this specification and the like, a barrier insulating film refers to an insulating film having a barrier property. In this specification and the like, a barrier property means a function of inhibiting diffusion of a particular substance (also referred to as having low permeability). Alternatively, a barrier property means a function of capturing or fixing (also referred to as gettering) a particular substance.

When one or both of the sidewall 121a and the sidewall 121b have the function of the barrier insulating layer or the gettering function, entry of impurities (typified by water or oxygen) that would be diffused into the light-emitting elements from the outside can be inhibited. With such a structure, a highly reliable display apparatus can be provided.

A gap 134 is formed in a region between the light-emitting elements 130 (between the sidewalls 121) and in the depression of the layer 101 including a transistor in some cases. FIG. 3A illustrates an example in which the gap 134 is formed between the layer 101 including a transistor and the common layer 114. Note that the gap 134 is not formed in some cases depending on the distance between adjacent light-emitting elements 130, the thickness of the common layer 114, the thickness of the common electrode 115, the thickness of the protective layer 131, and the like. In that case, a region between adjacent light-emitting elements 130 is filled with at least one of the common layer 114, the common electrode 115, and the protective layer 131. A region that would be the gap may be filled with an insulator.

The gap 134 contain, for example, any one or more selected from air, nitrogen, oxygen, carbon dioxide, and Group 18 elements (typified by helium, neon, argon, xenon, and krypton). Furthermore, for example, a gas used during the film formation of the common layer 114 or the like is sometimes contained in the gap. In the case where the common layer 114 is formed by a vacuum evaporation method, for example, the gap may be a reduced-pressure atmosphere. In the case where a gas is contained in the gap 134, a gas can be identified with a gas chromatography method or the like, for example.

In the case where the refractive index of the gap 134 is lower than the refractive index of the sidewall 121, light emitted from the light-emitting unit 112 is reflected at the interface between the sidewall 121 and the gap 134. Thus, light emitted from the light-emitting unit 112 can be inhibited from entering an adjacent pixel (or subpixel). This can inhibit mixture of light of different colors, thereby improving the display quality of the display apparatus.

A portion that would be the gap 134 may be filled with an insulator. As the material of the insulator, one or both of an organic insulating material and inorganic insulating material can be used. For the insulator, at least one of a solid substance, a gelatinous substance, and a liquid substance can be used.

Examples of the organic insulating material include an acrylic resin, an epoxy resin, a polyimide resin, a polyamide resin, a polyimide-amide resin, a polysiloxane resin, a benzocyclobutene-based resin, and a phenol resin. Any of a variety of resins that can be used for the resin layer 119 may be used.

Examples of the inorganic insulating material include an oxide insulating material, a nitride insulating material, an oxynitride insulating material, and a nitride oxide insulating material. An insulating material that can be used for the protective layer 131 and the protective layer 132 may be used.

As described above, the shape of a layer formed after the formation of the sidewall 121 varies depending on the material, the film formation method, the thickness, and the like, and is not particularly limited. The display apparatus of one embodiment of the present invention includes the sidewall 121; thus, a short circuit in the light-emitting element 130 is inhibited. Accordingly, the range of choices for the material, the film formation method, and the thickness of a layer formed after the formation of the sidewall 121 can be widened.

The display apparatus 100 preferably includes the protective layer 131 and the protective layer 132 over the light-emitting element 130. Providing the protective layer 131 and the protective layer 132 can increase the reliability of the light-emitting element 130. Note that the protective layer 131 or the protective layer 132 is not necessarily included in the display apparatus 100.

There is no limitation on the conductivity of the protective layer 131 and the protective layer 132. As the protective layer 131 and the protective layer 132, at least one type of insulating films, semiconductor films, and conductive films can be used.

The protective layer 131 and the protective layer 132 including inorganic films can inhibit oxidation of the common electrode 115 and entry of impurities (such as moisture and oxygen) into the light-emitting element 130. Accordingly, deterioration of the light-emitting element 130 can be inhibited, and the reliability of the display apparatus can be increased.

For each of the protective layer 131 and the protective layer 132, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film.

Note that in this specification and the like, oxynitride refers to a material that contains more oxygen than nitrogen, and nitride oxide refers to a material that contains more nitrogen than oxygen.

Each of the protective layer 131 and the protective layer 132 preferably includes a nitride insulating film or a nitride oxide insulating film, and further preferably includes a nitride insulating film.

For each of the protective layer 131 and the protective layer 132, an inorganic film containing an In—Sn oxide (also referred to as ITO), an In—Zn oxide, a Ga—Zn oxide, an Al—Zn oxide, an indium gallium zinc oxide (In—Ga—Zn oxide, also referred to as IGZO), or the like can also be used. The inorganic film preferably has high resistance, specifically, higher resistance than the common electrode 115. The inorganic film may further contain nitrogen.

When light emitted from the light-emitting element 130 is extracted through the protective layer 131 and the protective layer 132, the protective layer 131 and the protective layer 132 preferably have a high visible-light-transmitting property. For example, ITO, IGZO, and aluminum oxide are preferable because they are each an inorganic material having a high visible-light-transmitting property.

The protective layer 131 and the protective layer 132 can each have, for example, a stacked-layer structure of an aluminum oxide film and a silicon nitride film over the aluminum oxide film, or a stacked-layer structure of an aluminum oxide film and an IGZO film over the aluminum oxide film. The use of such a stacked-layer structure can suppress entry of impurities (e.g., water and oxygen) into the light-emitting unit 112.

Furthermore, the protective layer 131 and the protective layer 132 may each include an organic film. For example, the protective layer 132 may include both an organic film and an inorganic film.

The protective layer 131 and the protective layer 132 may be formed by different film formation methods. Specifically, the protective layer 131 may be formed by an ALD method, and the protective layer 132 may be formed by a sputtering method.

The coloring layer 133 is provided over the protective layer 132. The coloring layer 133 has a region overlapping with the light-emitting element 130. Specifically, a region overlapping with the light-emitting layer 183 is included. FIG. 3A illustrates an example in which a different coloring layer 133 (the coloring layer 133*a*, the coloring layer 133*b*, or the coloring layer 133*c*) is provided for each light-emitting element 130. The coloring layer 133*a*, the coloring layer 133*b*, and the coloring layer 133*c* have functions of transmitting light of different colors. For example, the coloring layer 133*a* has a function of transmitting red light, the coloring layer 133*b* has a function of transmitting green light, and the coloring layer 133*c* has a function of transmitting blue light. Thus, the display apparatus 100 is capable of full-color display. Note that the coloring layer 133*a*, the coloring layer 133b, and the coloring layer 133c may have functions of transmitting light of any of cyan, magenta, and yellow.

Here, adjacent coloring layers 133 preferably have an overlapping region. Specifically, a region where adjacent coloring layers 133 overlap with each other is preferably included in a region not overlapping with the light-emitting unit 112. When the coloring layers 133 transmitting light of different colors overlap with each other, the coloring layers 133 in a region where the coloring layers 133 overlap with each other can function as light-blocking layers. Thus, light emitted from the light-emitting element 130 can be inhibited from leaking to an adjacent subpixel. For example, light emitted from the light-emitting element 130 overlapping with the coloring layer 133a can be inhibited from entering the coloring layer 133b. Consequently, the contrast of an image to be displayed on the display apparatus can be increased to achieve a display apparatus with high display quality.

Note that a region where adjacent coloring layers 133 overlap with each other is not necessarily included. In that case, a light-blocking layer is preferably provided in a region not overlapping with the light-emitting unit 112. The light-blocking layer can be provided on a surface of the substrate 120 on the resin layer 119 side, for example. The coloring layer 133 may be provided on the surface of the substrate 120 on the resin layer 119 side.

An end portion of the top surface of the pixel electrode 111 is not covered with an insulating layer. Thus, the distance between adjacent light-emitting elements 130 can be extremely small. Accordingly, the display apparatus can have high resolution or high definition.

In the display apparatus 100, the distance between light-emitting elements 130 can be small. Specifically, the distance between the light-emitting elements 130 can be smaller than or equal to 1 μm, preferably smaller than or equal to 500 nm, further preferably smaller than or equal to 200 nm, smaller than or equal to 100 nm, smaller than or equal to 90 nm, smaller than or equal to 70 nm, smaller than or equal to 50 nm, smaller than or equal to 30 nm, smaller than or equal to 20 nm, smaller than or equal to 15 nm, or smaller than or equal to 10 nm. In other words, the display apparatus 100 includes, for example, a region where the distance between a side surface of light-emitting unit 112 included in the light-emitting element 130 and a side surface of light-emitting unit 112 included in its adjacent light-emitting element 130 is smaller than or equal to 1 μm, preferably smaller than or equal to 0.5 μm (500 nm), further preferably smaller than or equal to 100 nm.

In this specification and the like, adjacent components are not necessarily in contact with each other. For example, although the light-emitting units 112 included in adjacent light-emitting elements 130 are not in contact with each other, the two light-emitting units 112 can be regarded as being adjacent to each other.

A variety of optical members can be arranged on the outer surface of the substrate 120. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, an impact-absorbing layer, or the like may be arranged on the outer surface of the substrate 120.

For the substrate 120, glass, quartz, ceramics, sapphire, a resin, a metal, an alloy, a semiconductor, or the like can be used. The substrate on the side from which light from the light-emitting element is extracted is formed using a material which transmits the light. When the substrate 120 is formed using a flexible material, the flexibility of the display apparatus can be increased. Furthermore, a polarizing plate may be used as the substrate 120.

For the substrate 120, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for the substrate 120.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

As the resin layer 119, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. An adhesive sheet or the like may be used.

As materials for the gates, the source, and the drain of a transistor and conductive layers functioning as wirings and electrodes included in the display apparatus, any of metals such as aluminum, titanium, chromium, nickel, copper, yttrium, zirconium, molybdenum, silver, tantalum, and tungsten, or an alloy containing any of these metals as its main component can be used. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers. For example, a stacked film of indium tin oxide and an alloy of silver and magnesium is preferably used because conductivity can be increased. They can also be used for conductive layers such as wirings and electrodes included in the display apparatus, and conductive layers (e.g., a conductive layer functioning as a pixel electrode or a common electrode) included in a light-emitting element.

Examples of insulating materials that can be used for the insulating layers include a resin such as an acrylic resin and an epoxy resin, and an inorganic insulating material such as silicon oxide, silicon oxynitride, silicon nitride oxide, silicon nitride, and aluminum oxide.

Figures 4A, 4B, 4C:
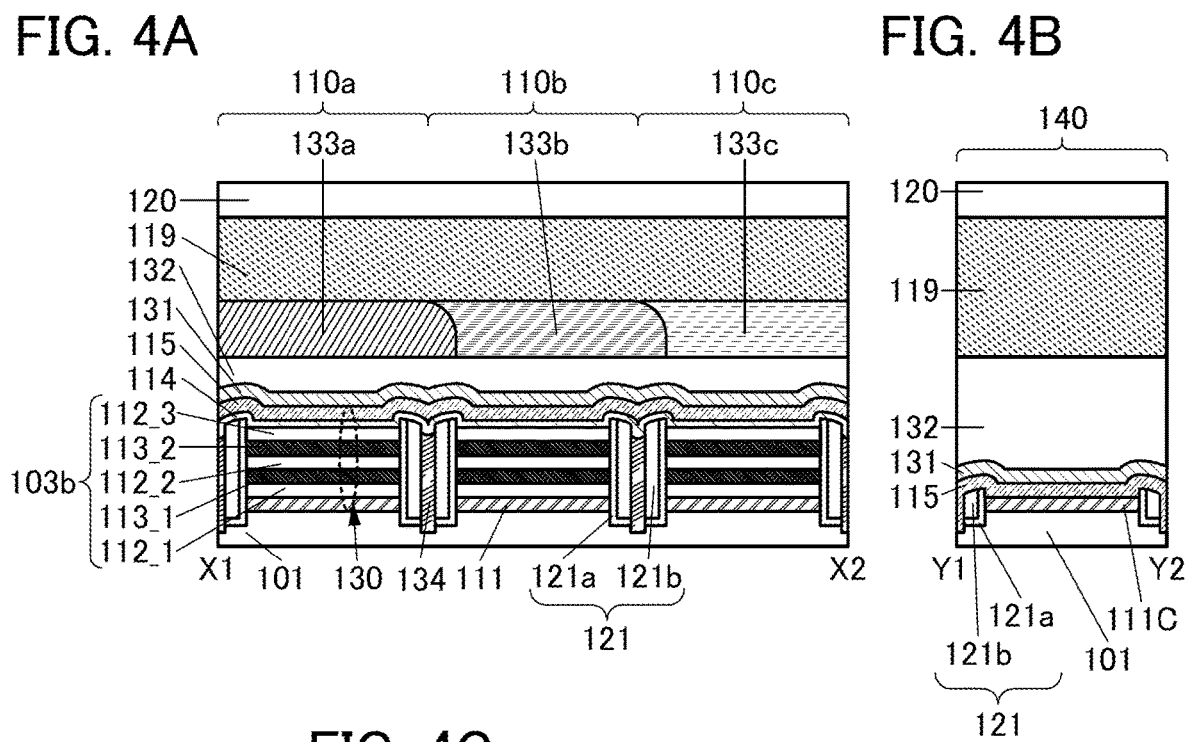
FIG. 4A and FIG. 4B are cross-sectional views illustrating a structure example of a display apparatus.
FIG. 4C is a cross-sectional view illustrating a structure example of a light-emitting unit.

Although FIG. 3A illustrates an example in which two light-emitting units 112 are stacked, one embodiment of the present invention is not limited thereto. FIG. 4A is a cross-sectional view illustrating a structure example along dashed-dotted line X1-X2 in FIG. 1 of the case where three light-emitting units 112 are stacked, and FIG. 4B is a cross-sectional view illustrating the structure example along dashed-dotted line Y1-Y2 in FIG. 1.

In the example illustrated in FIG. 4A, the light-emitting element 130 includes the pixel electrode 111 over the layer 101 including a transistor, the light-emitting unit 112_1 over the pixel electrode 111, an intermediate layer 113_1 over the light-emitting unit 112_1, the light-emitting unit 112_2 over the intermediate layer 113_1, an intermediate layer 113_2 over the light-emitting unit 112_2, a light-emitting unit 112_3 over the intermediate layer 113_2, the common layer 114 over the light-emitting unit 112_3, and the common electrode 115 over the common layer 114. Since the example illustrated in FIG. 4A has a structure in which three light-emitting units 112 are stacked, the structure can be referred to as three-unit tandem structure. Here, the light-emitting unit 112_1 to the light-emitting unit 112_3, the intermediate layer 113_1, and the intermediate layer 113_2 can be collectively referred to as a layer 103b.

FIG. 4C is a cross-sectional view illustrating a detailed structure example of the layer 103b. The light-emitting unit 112_3 includes, for example, the layer 182 over the intermediate layer 113_2, a light-emitting layer 183_3 over the layer 182, and the layer 184 over the light-emitting layer 183_3.

Each of the light-emitting layer 183_1 to the light-emitting layer 183_3 can emit any of, for example, red light, green light, and blue light. For example, the light-emitting layer 183_1 can emit red light, the light-emitting layer 183_2 can emit green light, and the light-emitting layer 183_3 can emit blue light. Alternatively, the light-emitting layer 183_1 can emit blue light, the light-emitting layer 183_2 can emit yellow light, yellow-green light, or green light, and the light-emitting layer 183_3 can emit blue light. Further alternatively, the light-emitting layer 183_1 can emit blue light, the light-emitting layer 183_2 can emit red light and yellow, yellow-green, or green light, and the light-emitting layer 183_3 can emit blue light.

Note that the light-emitting element 130 may have a structure in which four or more light-emitting units 112 are stacked. That is, the light-emitting element 130 may have a tandem structure with four or more units.

When the number of stacked light-emitting units 112 is increased as described above, luminance obtained from the light-emitting element 130 with the same amount of current can be increased in accordance with the number of stacked layers. Moreover, increasing the number of stacked light-emitting units 112 can reduce current necessary for obtaining the same luminance; thus, power consumption of the light-emitting element 130 can be reduced in accordance with the number of stacked layers.

Figures 5A, 5B:
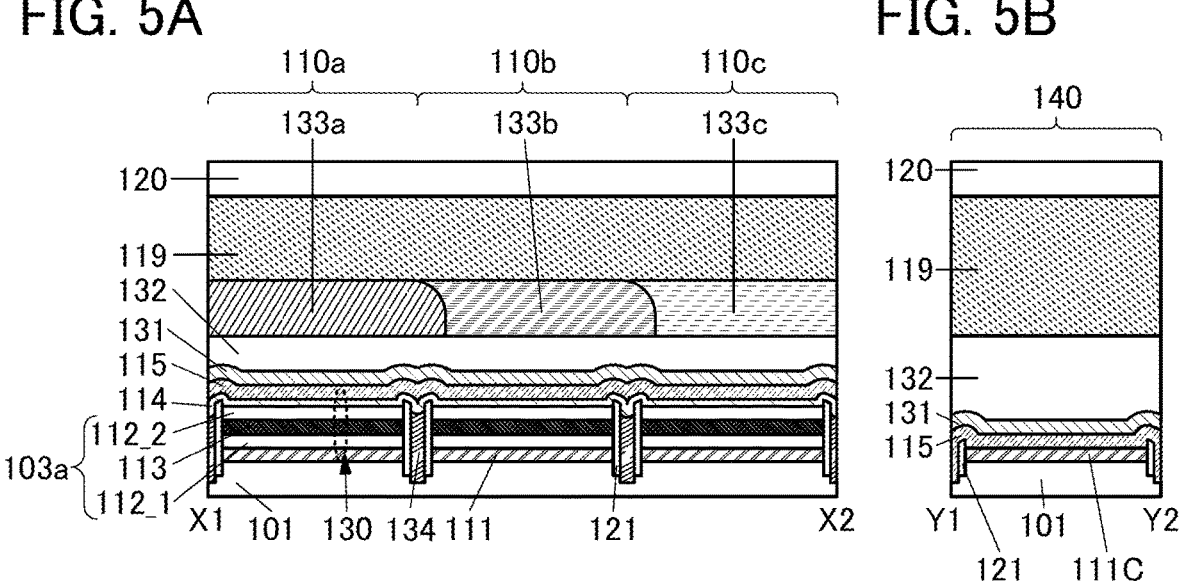
FIG. 5A and FIG. 5B are cross-sectional views illustrating a structure example of a display apparatus.

FIG. 5A is a cross-sectional view illustrating a structure example along dashed-dotted line X1-X2 in FIG. 1, and FIG. 5B is a cross-sectional view illustrating the structure example along dashed-dotted line Y1-Y2 in FIG. 1. FIG. 5A and FIG. 5B illustrate a modification example of the structure illustrated in FIG. 3A and FIG. 3B; it is different in that the sidewall 121 has a single-layer structure. In the structure illustrated in FIG. 5A and FIG. 5B, the sidewall 121 can be formed using a material similar to that of the sidewall 121a by a method similar to that for forming the sidewall 121a, for example. For the sidewall 121 illustrated in FIG. 5A and FIG. 5B, for example, an aluminum oxide film formed by an ALD method can be used.

When the display apparatus 100 has the structure illustrated in FIG. 5A and FIG. 5B, the formation process of the sidewall 121 can be simplified and the number of fabrication steps of the display apparatus 100 can be reduced. Accordingly, the display apparatus 100 can be fabricated at low cost and the yield can be improved. Thus, the cost of the display apparatus 100 can be reduced.

Figures 6A, 6B:
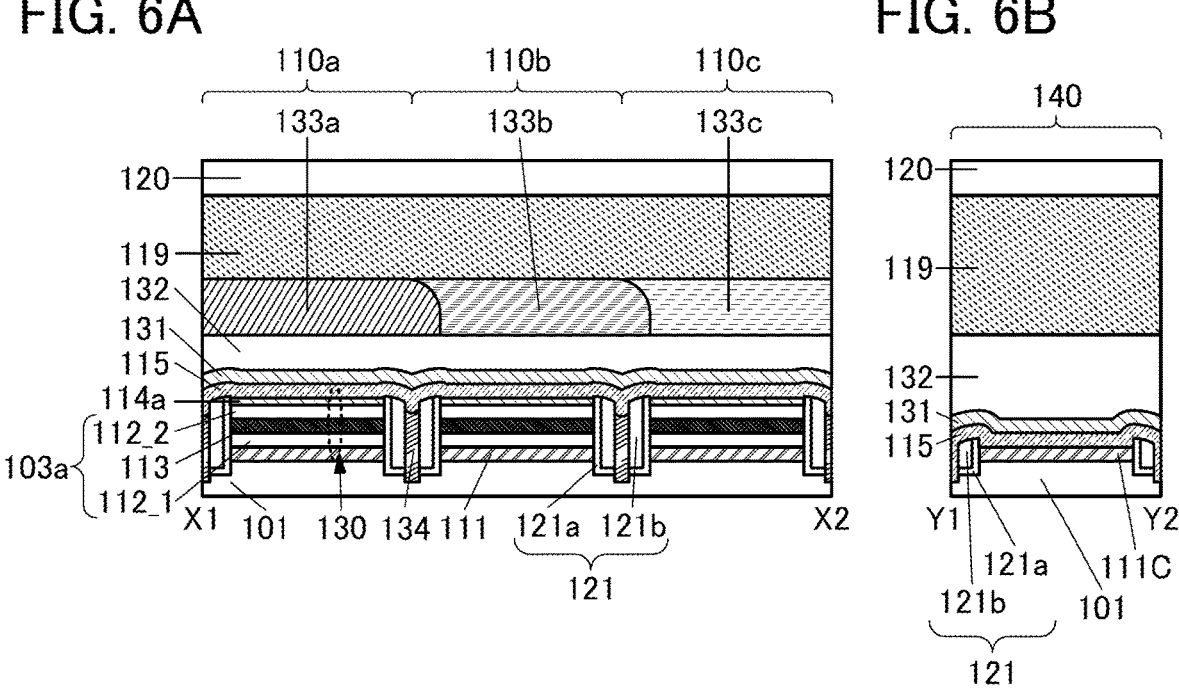
FIG. 6A and FIG. 6B are cross-sectional views illustrating a structure example of a display apparatus.

FIG. 6A is a cross-sectional view illustrating a structure example along dashed-dotted line X1-X2 in FIG. 1, and FIG. 6B is a cross-sectional view illustrating the structure example along dashed-dotted line Y1-Y2 in FIG. 1. FIG. 6A and FIG. 6B illustrate a modification example of the structure illustrated in FIG. 3A and FIG. 3B; it is different from the display apparatus 100 illustrated in FIG. 3A and FIG. 3B in that the light-emitting element 130 includes a layer 114a instead of the common layer 114.

The layer 114a can include an electron-injection layer, for example, like the common layer 114. Note that in the case where the pixel electrode 111 functions as a cathode and the common electrode 115 functions as an anode, the layer 114a can include a hole-injection layer, for example.

The layer 114a is formed in an island shape in each of the light-emitting elements 130, like the pixel electrode 111, the light-emitting units 112, and the intermediate layer 113. That is, the layer 114a is separately provided between the light-emitting elements 130.

FIG. 7A is a cross-sectional view illustrating a structure example along dashed-dotted line X1-X2 in FIG. 1, and FIG. 7B is a cross-sectional view illustrating the structure example along dashed-dotted line Y1-Y2 in FIG. 1. FIG. 7A and FIG. 7B illustrate a modification example of the structure illustrated in FIG. 3A and FIG. 3B, and illustrate an example in which the gap 134 is not formed in a region between adjacent light-emitting elements 130 and the region is filled with the common layer 114. Note that a region between adjacent light-emitting elements 130 may be filled with the common electrode 115 instead of the common layer 114. The region may be filled with the protective layer 131. In the case where the distance between adjacent light-emitting elements 130 is large, for example, the gap 134 is not formed in some cases as illustrated in FIG. 7A.

Even when a region between adjacent light-emitting elements 130 is filled with the common layer 114 or the like as illustrated in FIG. 7A, the common layer 114 can be inhibited from being in contact with a side surface of any of the pixel electrode 111, the light-emitting units 112, and the intermediate layer 113 because the display apparatus 100 includes the sidewall 121. Accordingly, a short circuit in the light-emitting element 130 can be inhibited even when the region between adjacent light-emitting elements 130 is filled with the common layer 114 or the like.

Figure 8:
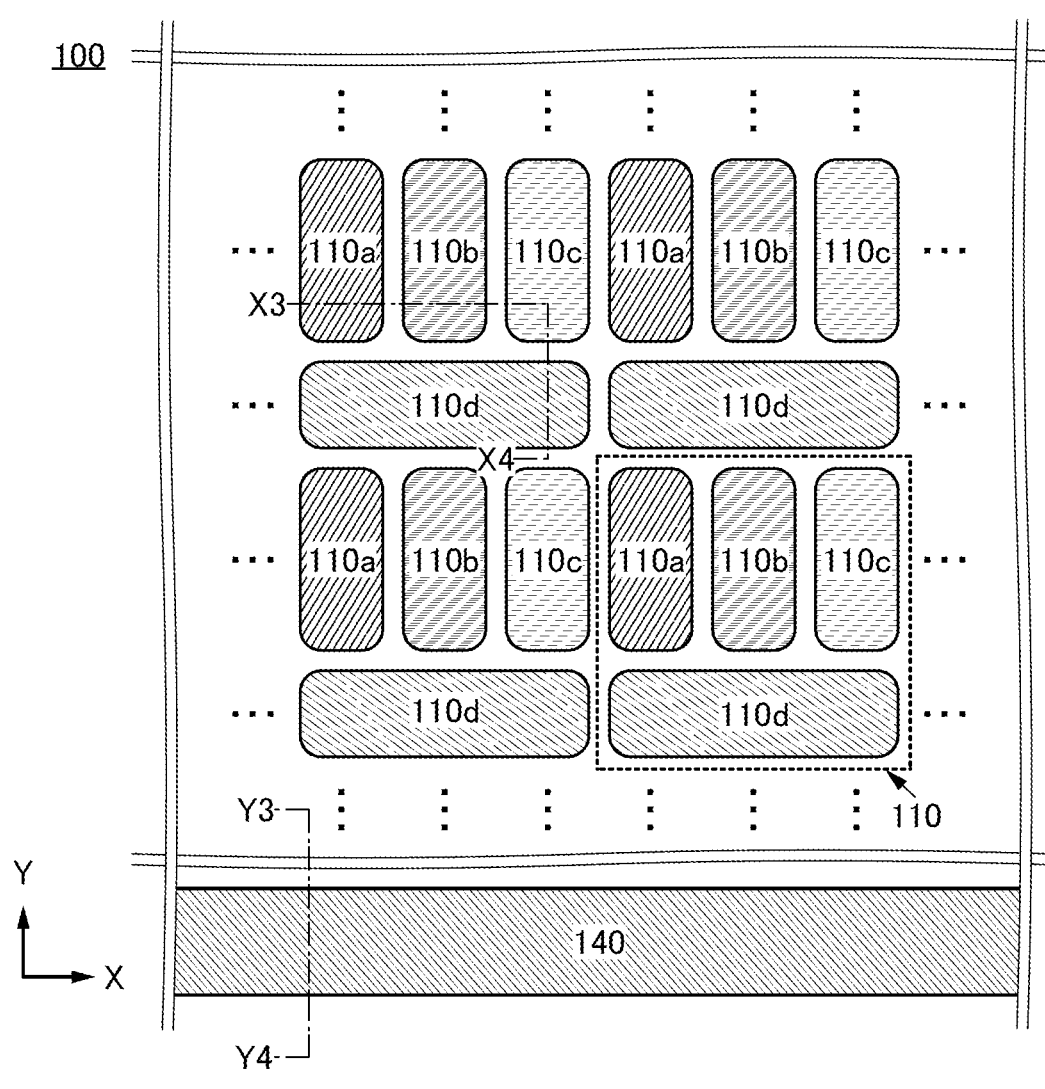
FIG. 8 is a top view illustrating a structure example of a display apparatus.

Although FIG. 1 illustrates an example in which the pixel 110 consists of three subpixels, the subpixel 110a, the subpixel 110b, and the subpixel 110c, one embodiment of the present invention is not limited thereto. FIG. 8 is a top view illustrating a structure example of the display apparatus 100.

The pixel 110 illustrated in FIG. 8 consists of four subpixels: the subpixel 110a, the subpixel 110b, the subpixel 110c, and a subpixel 110d. The subpixel 110a, the subpixel 110b, the subpixel 110c, and the subpixel 110d can be subpixels of different colors. For example, the subpixel 110a, the subpixel 110b, and the subpixel 110c can be a red subpixel, a green subpixel, and a blue subpixel, respectively, and the subpixel 110d can be a white subpixel.

FIG. 8 illustrates an example in which subpixels are arranged in two rows and three columns in one pixel 110. The pixel 110 includes three subpixels (the subpixel 110a, the subpixel 110b, and the subpixel 110c) in the upper row (first row) and one subpixel (the subpixel 110d) in the lower row (second row). In other words, the pixel 110 includes the subpixel 110a in the left column (first column), the subpixel 110b in the center column (second column), the subpixel 110c in the right column (third column), and the subpixel 110d across these three columns.

Figures 9A, 9B:
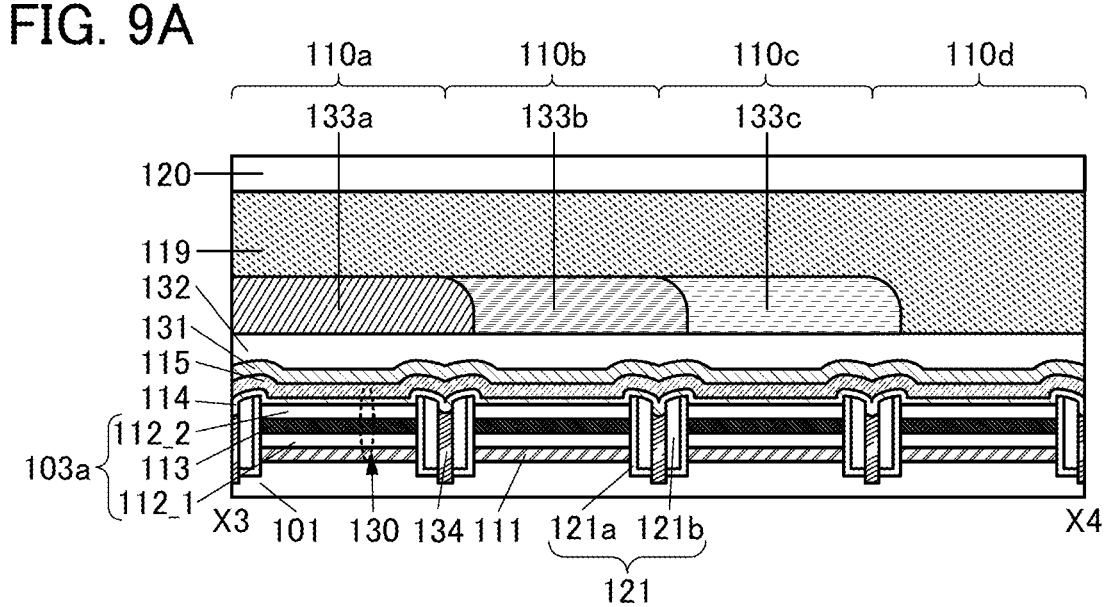
FIG. 9A and FIG. 9B are cross-sectional views illustrating a structure example of a display apparatus.

FIG. 9A is a cross-sectional view illustrating a structure example along dashed-dotted line X3-X4 in FIG. 8. FIG. 9B is a cross-sectional view illustrating the structure example along dashed-dotted line Y3-Y4 in FIG. 8, and is a cross-sectional view illustrating a structure example of the connection portion 140.

In the case where the light-emitting element 130 has a function of emitting white light, a subpixel not provided with the coloring layer 133 can be a white subpixel.

FIG. 10A to FIG. 10F are top views illustrating structure examples of the pixel 110 including the subpixel 110a, the subpixel 110b, the subpixel 110c, and the subpixel 110d, which are modification examples of the pixel 110 illustrated in FIG. 8.

Figures 10A, 10B, 10C:
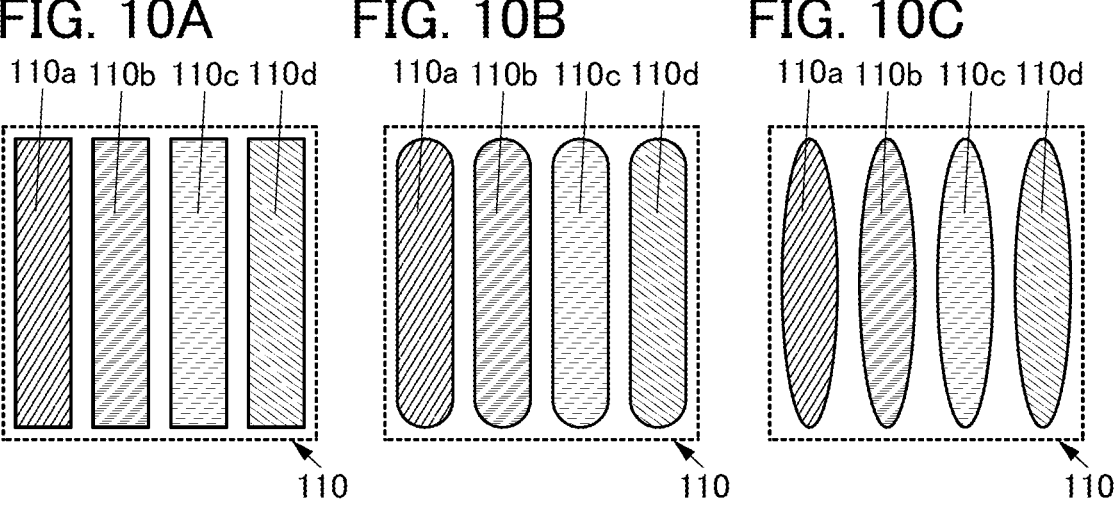
FIG. 10A to FIG. 10F are top views illustrating structure examples of a display apparatus.

The pixels 110 illustrated in FIG. 10A to FIG. 10C employ stripe arrangement. The pixels 110 illustrated in FIG. 10D to FIG. 10F employ matrix arrangement.

Figures 10D, 10E, 10F:
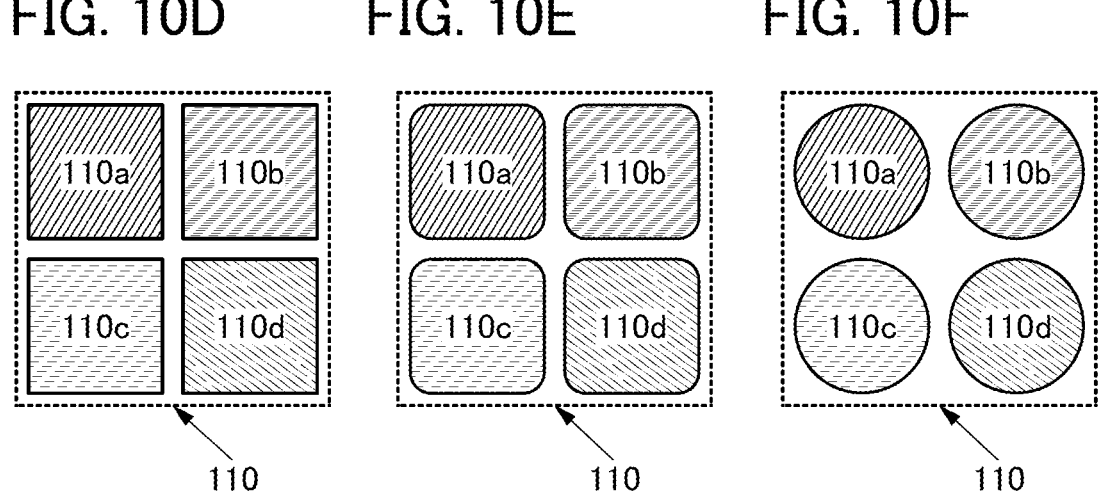

FIG. 10A illustrates an example in which each subpixel has a rectangular top surface shape, FIG. 10B illustrates an example in which each subpixel has a top surface shape formed by combining two half circles and a rectangle, and FIG. 10C illustrates an example in which each subpixel has an elliptical top surface shape. FIG. 10D illustrates an example in which each subpixel has a square top surface shape, FIG. 10E illustrates an example in which each subpixel has a substantially square top surface shape with rounded corners, and FIG. 10F illustrates an example in which each subpixel has a circular top surface shape.

[Example of Fabrication Method of Display Apparatus]

Next, an example of a fabrication method of the display apparatus 100 will be described. Specifically, an example of a fabrication method of the display apparatus 100 illustrated in FIG. 1, FIG. 3A, FIG. 3B, and the like will be described.

FIG. 11A to FIG. 11E, FIG. 12A to FIG. 12E, and FIG. 13A and FIG. 13B are cross-sectional views illustrating an example of the fabrication method of the display apparatus 100, each illustrating a cross-sectional view along dashed-dotted line X1-X2 and a cross-sectional view along Y1-Y2 in FIG. 1 side by side.

Thin films that form the display apparatus (insulating films, semiconductor films, conductive films, and the like) can be formed by a sputtering method, a CVD method, a vacuum evaporation method, a pulsed laser deposition (PLD) method, an ALD method, or the like. Examples of the CVD method include a plasma-enhanced chemical vapor deposition (PECVD: Plasma Enhanced CVD) method and a thermal CVD method. As an example of the thermal CVD method, a metal organic CVD (MOCVD: Metal Organic CVD) method can be given.

The thin films that form the display apparatus (insulating films, semiconductor films, conductive films, and the like) can be formed by a method such as spin coating, dipping, spray coating, ink-jetting, dispensing, screen printing, offset printing, a doctor knife, slit coating, roll coating, curtain coating, or knife coating.

For fabrication of the light-emitting elements, a vacuum process such as an evaporation method or a solution process such as a spin coating method or an ink-jet method can be especially used. As the evaporation method, a physical vapor deposition method (PVD method) such as a sputtering method, an ion plating method, an ion beam evaporation method, a molecular beam evaporation method, or a vacuum evaporation method, a chemical vapor deposition method (CVD method), and the like can be given. Specifically, the functional layers (e.g., the hole-injection layer, the hole-transport layer, the light-emitting layer, and the electron-transport layer) included in the light-emitting units can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, or micro-contact printing), or the like.

When the thin films that form the display apparatus are processed, a photolithography method or the like can be used for the processing. Alternatively, a nanoimprinting method, a sandblasting method, a lift-off method, or the like may be used for the processing of the thin films. Island-shaped thin films may be directly formed by a film formation method using a blocking mask such as a metal mask.

There are the following two typical examples of a photolithography method. In one of the methods, a resist mask is formed over a thin film that is to be processed, the thin film is processed by etching or the like, and the resist mask is removed. In the other method, after a photosensitive thin film is formed, light exposure and development are performed, so that the thin film is processed into a desired shape.

As the light used for light exposure in the photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Light exposure may be performed by liquid immersion light exposure technique. As the light used for the light exposure, extreme ultraviolet light (EUV) or X-rays may be used. Furthermore, instead of the light used for the light exposure, an electron beam can also be used. It is preferable to use extreme ultraviolet light, X-rays, or an electron beam because extremely minute processing can be performed. Note that in the case of performing light exposure by scanning of a beam such as an electron beam, a photomask is not needed.

For processing of the thin film, a dry etching method, a wet etching method, a sandblasting method, or the like can be used.

To fabricate the display apparatus 100, first, the layer 101 including a transistor is formed. As described above, the outermost surface of the layer 101 including a transistor can be an insulating layer. Subsequently, a conductive film 111A to be the pixel electrode 111 and the connection electrode 111C later is formed over the layer 101 including a transistor.

Next, a layer 112_1A to be the light-emitting unit 112_1 is formed over the conductive film 111A. Specifically, a film to be the layer 181 later, a film to be the layer 182 later, a light-emitting film to be the light-emitting layer 183_1 later, and a film to be the layer 184 later are formed in this order. After that, an intermediate film 113A to be the intermediate layer 113 later is formed over the layer 112_1A.

Next, a layer 112_2A to be the light-emitting unit 112_2 is formed over the intermediate film 113A. Specifically, a film to be the layer 182 later, a light-emitting film to be the light-emitting layer 183_2 later, and a film to be the layer 184 are formed in this order.

The films included in the layer 112_1A, the intermediate film 113A, and the films included in the layer 112_2A can be formed by an evaporation method, a sputtering method, or an ink-jet method, for example. Without limitation to this, the above-described film formation method can be used as appropriate.

It is preferred that the layer 112_1A, the intermediate film 113A, and the layer 112_2A be not provided in the connection portion 140. In the case where the films included in the layer 112_1A, the intermediate film 113A, and the films included in the layer 112_2A are formed by an evaporation method (or a sputtering method), for example, a shielding mask is preferably used so that these films are not formed in the connection portion 140.

Next, a sacrificial film 141 is formed over the layer 112_2A. The sacrificial film 141 is also provided in the connection portion 140.

As the sacrificial film 141, it is possible to use a film highly resistant to etching treatment performed on the films included in the layer 112_2A, the intermediate film 113A, and the films included in the layer 112_1A, i.e., a film having high etching selectivity. Furthermore, as the sacrificial film 141, it is possible to use a film having high etching selectivity with respect to a protective film such as a protective film 143 described later. Moreover, as the sacrificial film 141, it is possible to use a film that can be removed by a wet etching method that is less likely to cause damage to the films included in the layer 112_2A, the intermediate film 113A, and the films included in the layer 112_1A.

As the sacrificial film 141, an inorganic film such as a metal film, an alloy film, a metal oxide film, a semiconductor film, or an inorganic insulating film can be used, for example. The sacrificial film 141 can be formed by any of a variety of film formation methods such as a sputtering method, an evaporation method, a CVD method, and an ALD method.

For the sacrificial film 141, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used, for example. It is particularly preferable to use a low-melting-point material such as aluminum or silver.

Alternatively, for the sacrificial film 141, a metal oxide such as an indium gallium zinc oxide (an In—Ga—Zn oxide, also referred to as IGZO) can be used. It is also possible to use indium oxide, an indium zinc oxide (an In—Zn oxide), an indium tin oxide (an In—Sn oxide), an indium titanium oxide (an In—Ti oxide), an indium tin zinc oxide (an In—Sn—Zn oxide), an indium titanium zinc oxide (an In—Ti—Zn oxide), an indium gallium tin zinc oxide (an In—Ga—Sn—Zn oxide), or the like. Alternatively, an indium tin oxide containing silicon can also be used.

Note that an element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) can be employed instead of gallium. In particular, M is preferably one or more selected from gallium, aluminum, and yttrium.

Alternatively, an inorganic insulating material such as aluminum oxide, hafnium oxide, or silicon oxide can be used for the sacrificial film 141.

Alternatively, for the sacrificial film 141, it is preferable to use a material that can be dissolved in a solvent chemically stable. In particular, a material that is dissolved in water or alcohol can be suitably used for the sacrificial film 141. In formation of the sacrificial film 141, it is preferable that application of such a material that has been dissolved in a solvent such as water or alcohol be performed by a wet film formation method and followed by heat treatment for evaporating the solvent. At this time, the heat treatment is preferably performed in a reduced-pressure atmosphere because the solvent can be removed at a low temperature in a short time and thermal damage to the layer 112_2A, the intermediate film 113A, and the layer 112_1A can be reduced accordingly.

Examples of the wet film formation method that can be used for forming the sacrificial film 141 include spin coating, dipping, spray coating, ink-jetting, dispensing, screen printing, offset printing, a doctor knife method, slit coating, roll coating, curtain coating, knife coating, and the like.

For the sacrificial film 141, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin can be used.

Figures 11A, 11B, 11C, 11D, 11E:
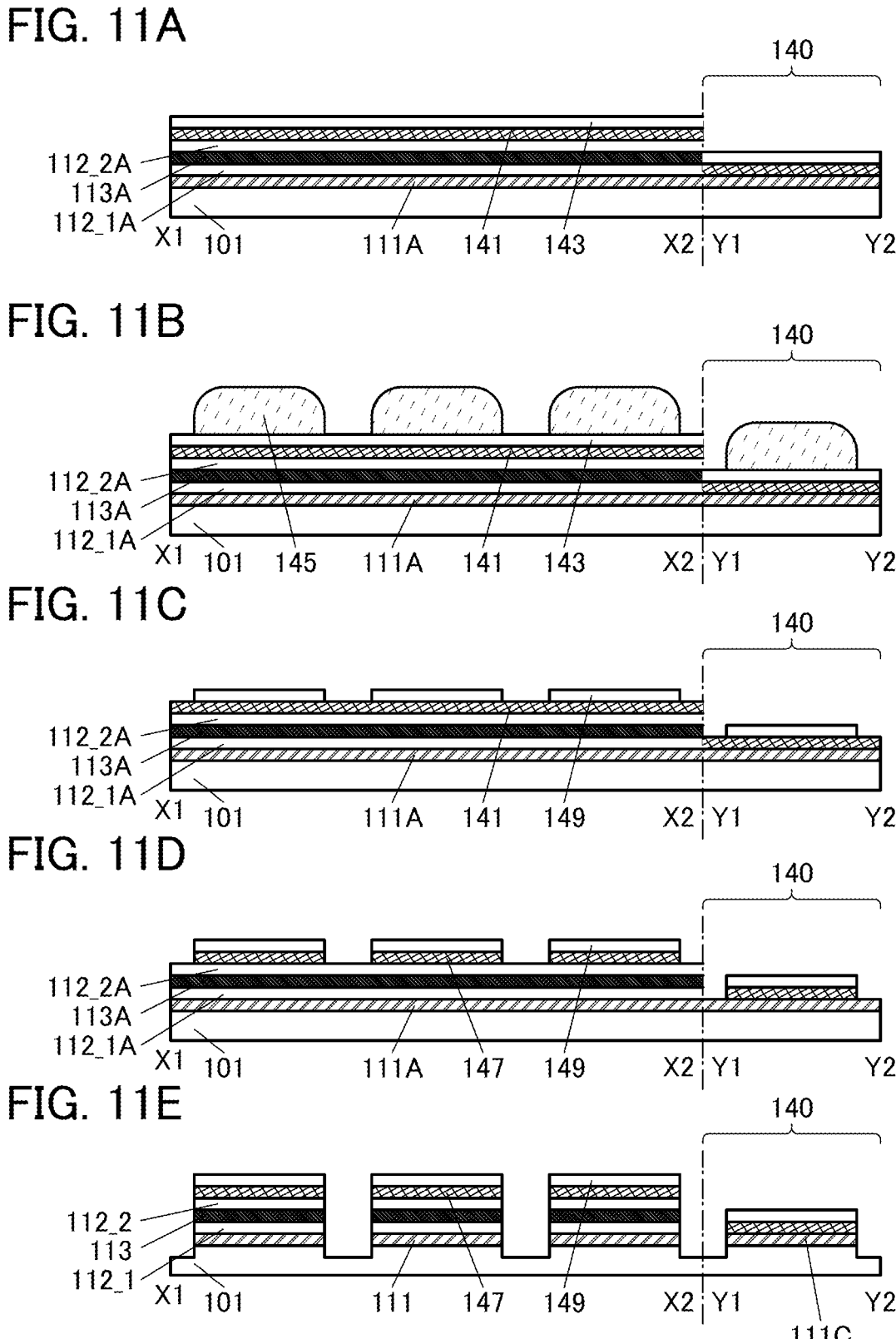
FIG. 11A to FIG. 11E are top views illustrating an example of a fabrication method of a display apparatus.

Next, the protective film 143 is formed over the sacrificial film 141 (FIG. 11A).

The protective film 143 is a film used as a mask when the sacrificial film 141 is etched later. In addition, when the sacrificial film 143 is etched later, the sacrificial film 141 is exposed. Thus, a combination of films having high etching selectivity therebetween is selected for the sacrificial film 141 and the protective film 143. It is thus possible to select a film that can be used for the protective film 143 depending on etching conditions of the sacrificial film 141 and etching conditions of the protective film 143.

For example, in the case where dry etching using a gas containing fluorine (also referred to as a fluorine-based gas) is used for etching of the protective film 143, silicon, silicon nitride, silicon oxide, tungsten, titanium, molybdenum, tantalum, tantalum nitride, an alloy containing molybdenum and niobium, an alloy containing molybdenum and tungsten, or the like can be used for the protective film 143. Here, a metal oxide film such as IGZO or ITO is given as a film having high etching selectivity (that is, enabling low etching rate) in dry etching using the fluorine-based gas, and such a film can be used for the protective film 143.

Note that without being limited to this, a material of the protective film 143 can be selected from a variety of materials depending on the etching condition of the sacrificial film 141 and the etching condition of the protective film 143. For example, any of the films that can be used for the sacrificial film 141 can also be used.

For the protective film 143, a nitride film can be used, for example. Specifically, it is also possible to use a nitride such as silicon nitride, aluminum nitride, hafnium nitride, titanium nitride, tantalum nitride, tungsten nitride, gallium nitride, or germanium nitride.

Alternatively, an oxide film can be used for the protective film 143. An oxide film or an oxynitride film of silicon oxide, silicon oxynitride, aluminum oxide, aluminum oxynitride, hafnium oxide, hafnium oxynitride, or the like can also be typically used.

Next, a resist mask 145 is formed over the protective film 143 (FIG. 11B).

For the resist mask 145, a resist material containing a photosensitive resin, such as a positive type resist material or a negative type resist material can be used.

Here, in the case where the protective film 143 is not formed and the resist mask 145 is formed over the sacrificial film 141, when a defect such as a pinhole exists in the sacrificial film 141, there is a risk of dissolving a film to be the layer 184 or the like included in the layer 112_2A, due to a solvent of the resist material. Such a defect can be prevented by using the protective film 143.

Note that in the case where a film that is unlikely to cause a defect such as a pinhole is used as the sacrificial film 141, the resist mask 145 may be formed directly on the sacrificial film 141 without using the protective film 143.

Next, part of the protective film 143 that is not covered with the resist mask 145 is removed by etching to form a protective layer 149. At that time, the protective layer 149 is formed also in the connection portion 140.

In the etching of the protective film 143, an etching condition with high selectively is preferably used so that the sacrificial film 141 is not removed by the etching. Either wet etching or dry etching can be performed for the etching of the protective film 143; with the use of dry etching, a reduction in a processing pattern of the protective film 143 can be inhibited.

Next, the resist mask 145 is removed (FIG. 11C).

The resist masks 145 can be removed by wet etching or dry etching. It is particularly preferable to perform dry etching (also referred to as plasma ashing) using an oxygen gas as an etching gas to remove the resist mask 145.

At this time, the removal of the resist mask 145 is performed in a state where the sacrificial film 141 is provided over the layer 112_2A; thus, the influence on the layer 112_2A, the intermediate film 113A, and the layer 112_1A is inhibited. In particular, when the layer 112_1A and the layer 112_2A are exposed to oxygen, the electrical characteristics are adversely affected in some cases; thus, it is suitable in the case where etching using an oxygen gas, such as plasma ashing, is performed.

Next, part of the sacrificial film 141 that is not covered with the protective layer 149 is removed by etching with the use of the protective layer 149 as a mask, so that a sacrificial layer 147 is formed (FIG. 11D). At that time, the sacrificial layer 147 is concurrently formed also in the connection portion 140.

Either wet etching or dry etching can be performed for the etching of the sacrificial film 141; the use of a dry etching method is preferable because pattern shrinkage can be inhibited.

Next, parts of the layer 112_2A, the intermediate film 113A, the layer 112_1A, and the conductive film 111A that are not covered with the sacrificial layer 147 are removed by etching using the sacrificial layer 147 as a mask to form the light-emitting unit 112_2, the intermediate layer 113, the light-emitting unit 112_1, the pixel electrode 111, and the connection electrode 111C (FIG. 11E). Note that the protective layer 149 may be removed by etching at the same time as the etching of the layer 112_2A, the intermediate film 113A, the layer 112_1A, and the conductive film 111A or before the etching.

The etching of the layer 112_2A, the intermediate film 113A, the layer 112_1A, and the conductive film 111A is preferably performed by dry etching using an etching gas that does not contain oxygen as its main component. In that case, the alteration of the layer 112_2A, the intermediate film 113A, the layer 112_1A, and the conductive film 111A can be inhibited; thus, a highly reliable display apparatus can be obtained. Examples of the etching gas that does not contain oxygen as its main component include $CF_4$, $C_4F_8$, $SF_6$, $CHF_3$, $Cl_2$, $H_2O$, $BCl_3$, $H_2$, or a noble gas such as He. Alternatively, a mixed gas of the above gas and a dilute gas that does not contain oxygen can be used as the etching gas.

At the time of the etching of the conductive film 111A, part of the layer 101 including a transistor (specifically, the insulating layer positioned at the outermost surface) is etched and a depression is formed, in some cases. Although the description below is made using the case where a depression is provided in the layer 101 including a transistor as an example, the depression is not necessarily provided.

Then, an insulating film 121A to be the sidewall 121a later is formed to cover the pixel electrode 111, the connection electrode 111C, the light-emitting unit 112_1, the intermediate layer 113, the light-emitting unit 112_2, the sacrificial layer 147, and the protective layer 149. Next, an insulating film 121B to be the sidewall 121b later is formed over the insulating film 121A (FIG. 12A).

The insulating film 121A is preferably formed by a method that causes less damage to the light-emitting unit 112. The insulating film 121A and the insulating film 121B are formed at a temperature lower than the upper temperature limit of the light-emitting unit 112. For example, an aluminum oxide film can be formed as the insulating film 121A by an ALD method. An ALD method is preferably used because a film with good coverage can be formed. Furthermore, for example, a silicon oxynitride film or a silicon nitride film can be formed as the insulating film 121B by a PECVD method or a sputtering method.

Figures 12A, 12B, 12C, 12D, 12E:
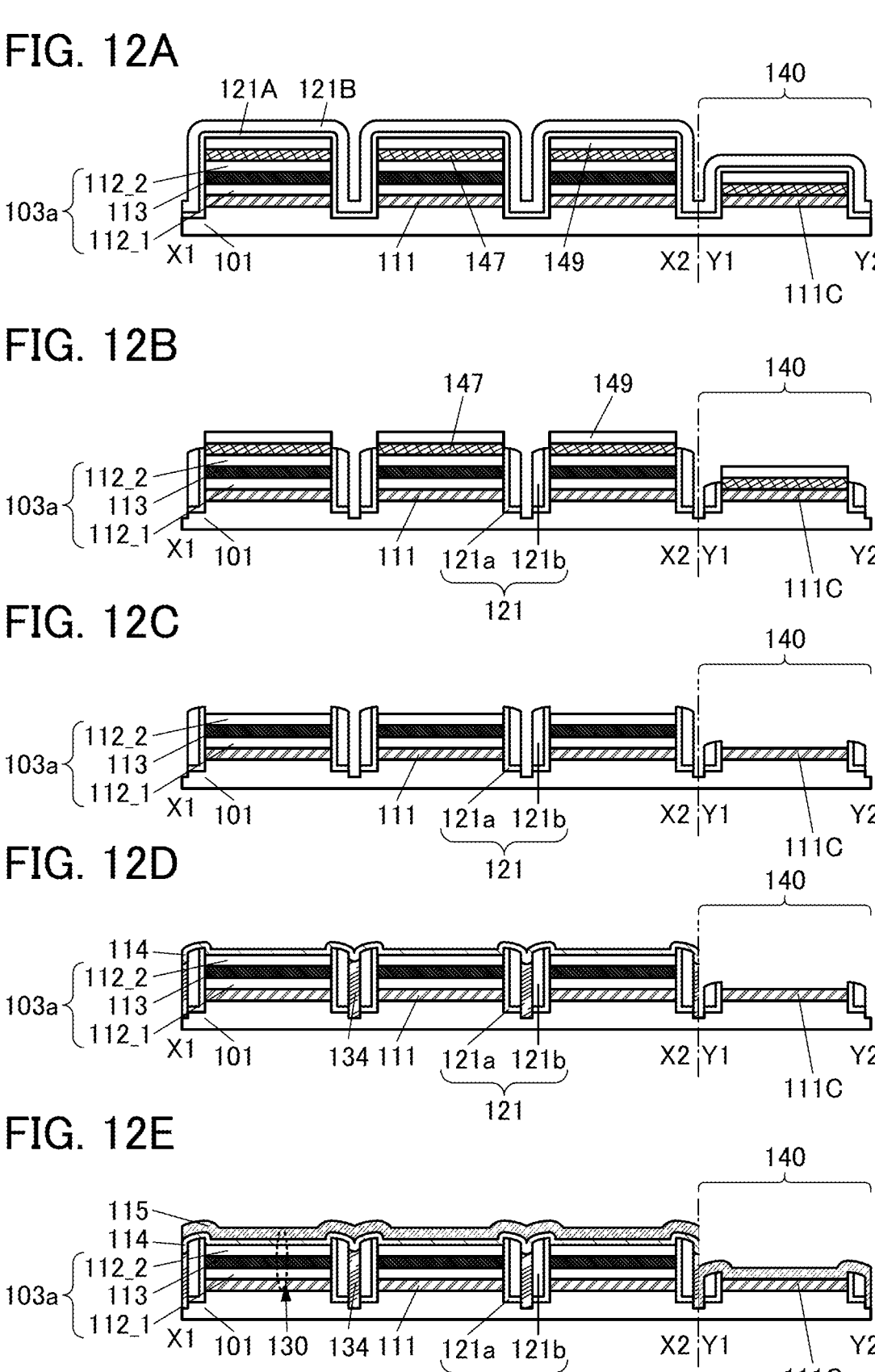
FIG. 12A to FIG. 12E are cross-sectional views illustrating an example of a fabrication method of a display apparatus.

Next, the insulating film 121B and the insulating film 121A are etched, whereby the sidewall 121b and the sidewall 121a are formed (FIG. 12B). The sidewall 121a is formed to cover at least part of a side surface of the pixel electrode 111 and part of a side surface of the connection electrode 111C. Accordingly, a short circuit in the light-emitting element caused when the common layer 114 or the common electrode 115 formed later is in contact with the pixel electrode 111 or the connection electrode 111C can be inhibited. Moreover, the sidewall 121a is preferably formed to cover at least part of a side surface of the light-emitting unit 112_1, part of a side surface of the intermediate layer 113, and part of a side surface of the light-emitting unit 112_2. Accordingly, the common layer 114 or the common electrode 115 formed later can be inhibited from being in contact with the light-emitting unit 112_1, the intermediate layer 113, and the light-emitting unit 112_2, and a short circuit in the light-emitting element can be inhibited. Furthermore, damage to the light-emitting unit 112_1, the intermediate layer 113, and the light-emitting unit 112_2 in a later step can be reduced.

It is particularly preferred that a depression be provided in part of the layer 101 including a transistor (specifically, the insulating layer positioned at the outermost surface) because the sidewall 121a can cover the entire side surface of the pixel electrode 111 and the entire side surface of the connection electrode 111C.

Here, the sidewall 121b is formed to cover at least part of a side surface of the sidewall 121a.

The insulating film 121A and the insulating film 121B are preferably etched by a dry etching method. The etching of the insulating film 121A and the insulating film 121B are preferably performed by anisotropic etching. Here, the insulating film 121A and the insulating film 121B can be etched using an etching gas that can be used for the etching of the sacrificial film 141. Since the light-emitting unit 112_2 is not exposed in the etching of the insulating film 121A and the insulating film 121B, range of choice for an etching method is wider than that for the etching of the sacrificial film 141. Specifically, a gas containing oxygen may be used as an etching gas for the etching of the insulating film 121A and the insulating film 121B.

Next, the sacrificial layer 147 and the protective layer 149 are removed (FIG. 12C). As a result, the light-emitting unit 112_2 and the connection electrode 111C are exposed.

Next, the common layer 114 is formed over the sidewall 121 and over the light-emitting unit 112_2 (FIG. 12D). Accordingly, the gap 134 is formed in a region between the sidewalls 121b and in the depression of the layer 101 including a transistor in some cases. Here, the common layer 114 is not provided over the connection electrode 111C, and the connection electrode 111C remains exposed. As described above, the common layer 114 functions as one of an electron-injection layer and a hole-injection layer.

The common layer 114 can be formed by a method such as an evaporation method (including a vacuum evaporation method), a transfer method, a printing method, an inkjet method, or a coating method.

The common layer 114 is provided to cover at least part of the top surface of the light-emitting unit 112_2 and part of the top surface and a side surface of the sidewall 121. In the case where the common layer 114 has high conductivity, the light-emitting element might be short-circuited when the common layer 114 is in contact with the pixel electrode 111. However, since the sidewall 121 covers the side surface of the pixel electrode 111, the side surface of the light-emitting unit 112_1, the side surface of the intermediate layer 113, and the side surface of the light-emitting unit 112_2 in the display apparatus of one embodiment of the present invention, the common layer 114 having high conductivity can be inhibited from being in contact with these components, and a short circuit in the light-emitting element can be inhibited. Thus, the reliability of the light-emitting element can be increased.

Next, the common electrode 115 is formed over the common layer 114 and over the connection electrode 111C (FIG. 12E). In this manner, the light-emitting element 130 is formed. The common electrode 115 can be formed by a sputtering method or a vacuum evaporation method, for example.

Figures 13A, 13B:
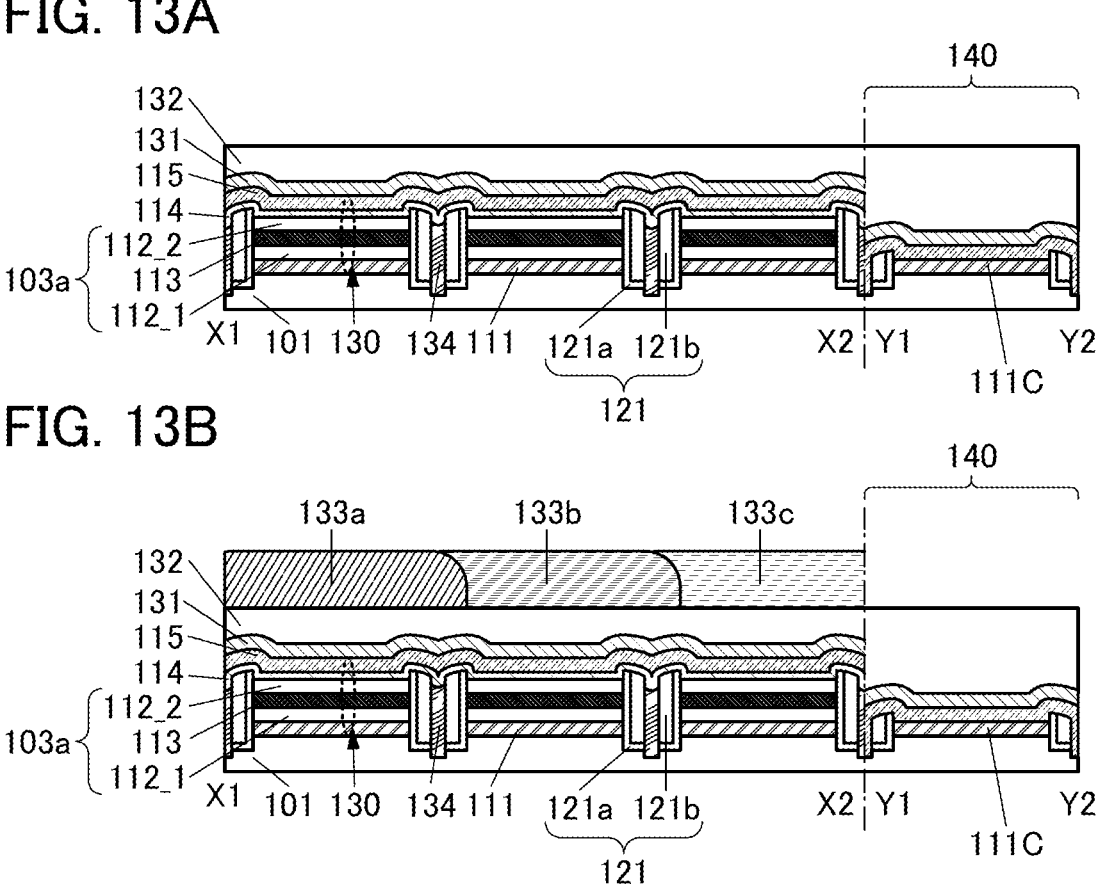
FIG. 13A and FIG. 13B are cross-sectional views illustrating an example of a fabrication method of a display apparatus.

Next, the protective layer 131 is formed over the common electrode 115, and the protective layer 132 is formed over the protective layer 131 (FIG. 13A). Examples of methods for forming the protective layer 131 and the protective layer 132 include a vacuum evaporation method, a sputtering method, a CVD method, and an ALD method. The protective layer 131 and the protective layer 132 may be films formed by different film formation methods. The protective layer 131 and the protective layer 132 may each have a single-layer structure or a stacked-layer structure.

Next, each of the coloring layer 133a, the coloring layer 133b, and the coloring layer 133c is formed over the protective layer 132 to have a region overlapping with the light-emitting unit 112_1 and the light-emitting unit 112_2 (FIG. 13B). Each of the coloring layer 133a, the coloring layer 133b, and the coloring layer 133c can be formed at a desired position by an ink-jet method, a photolithography method, or the like. Specifically, a different coloring layer 133 (the coloring layer 133a, the coloring layer 133b, or the coloring layer 133c) can be formed for each light-emitting element 130.

After that, the substrate 120 is bonded onto the coloring layer 133 with the resin layer 119, whereby the display apparatus 100 illustrated in FIG. 3A and FIG. 3B can be fabricated. As described above, in the fabrication method of the display apparatus in this embodiment, the island-shaped light-emitting unit including the light-emitting layer is formed not by using a pattern of a metal mask but by etching a light-emitting unit formed entirely. Accordingly, the island-shaped light-emitting unit can be formed with a uniform thickness. Furthermore, a high-resolution display apparatus or a display apparatus with a high aperture ratio can be obtained.

The display apparatus of one embodiment of the present invention includes a light-emitting element with a tandem structure. A side surface of each of a pixel electrode, a light-emitting layer, a carrier-transport layer, and an intermediate layer included in the light-emitting element is covered with a sidewall. In a fabrication method of the display apparatus, a light-emitting unit included in the light-emitting element is etched in a state where the light-emitting layer and the carrier-transport layer are stacked. Thus, the display apparatus has a structure with which damage to the light-emitting layer is reduced. In addition, the sidewall inhibits the pixel electrode from being in contact with a carrier-injection layer or a common electrode and inhibits a short circuit in the light-emitting element.

This embodiment can be combined with the other embodiments as appropriate. In the case where a plurality of structure examples are described in one embodiment in this specification, the structure examples can be combined as appropriate.

Embodiment 2

In this embodiment, the display apparatus of one embodiment of the present invention will be described with reference to FIG. 14 to FIG. 19.

The display apparatus in this embodiment can be a high-definition display apparatus or large-sized display apparatus. Accordingly, the display apparatus of this embodiment can be used for display portions of electronic apparatuses such as a digital camera, a digital video camera, a digital photo frame, a mobile phone, a portable game console, a portable information terminal, and an audio reproducing device, in addition to display portions of electronic devices with a relatively large screen, such as a television device, a desktop or notebook personal computer, a monitor of a computer or the like, digital signage, and a large game machine such as a pachinko machine.

The display apparatus in this embodiment can be a high-resolution display apparatus. Accordingly, the display apparatus in this embodiment can be used for display portions of information terminals (wearable devices) such as watch-type and bracelet-type information terminals and display portions of wearable devices capable of being worn on the head, such as a VR device like a head mounted display and a glasses-type AR device.

[Display Module]

Figure 14A:
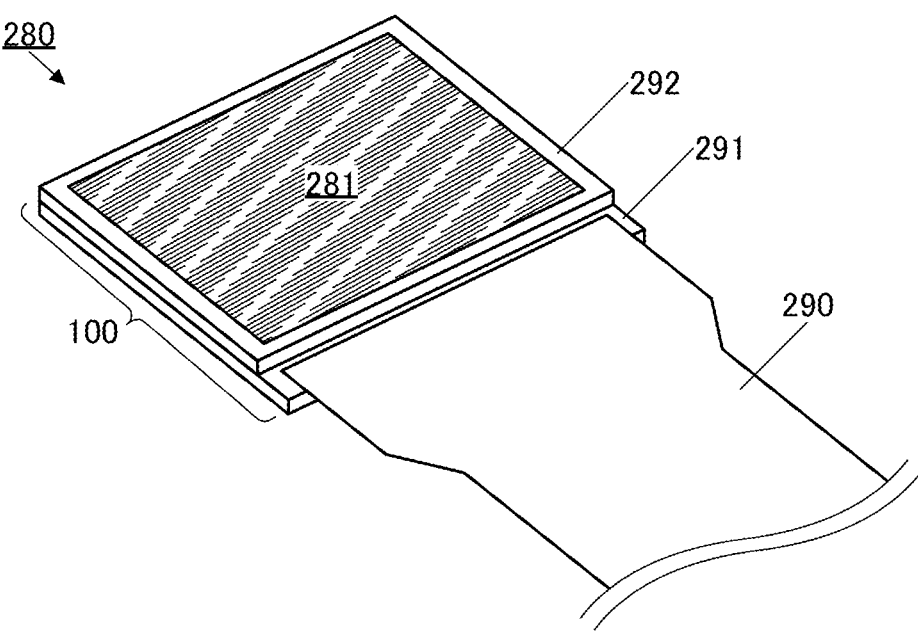
FIG. 14A and FIG. 14B are perspective views illustrating a structure example of a display module.

FIG. 14A is a perspective view of a display module 280. The display module 280 includes the display apparatus 100 and an FPC 290.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 14B:
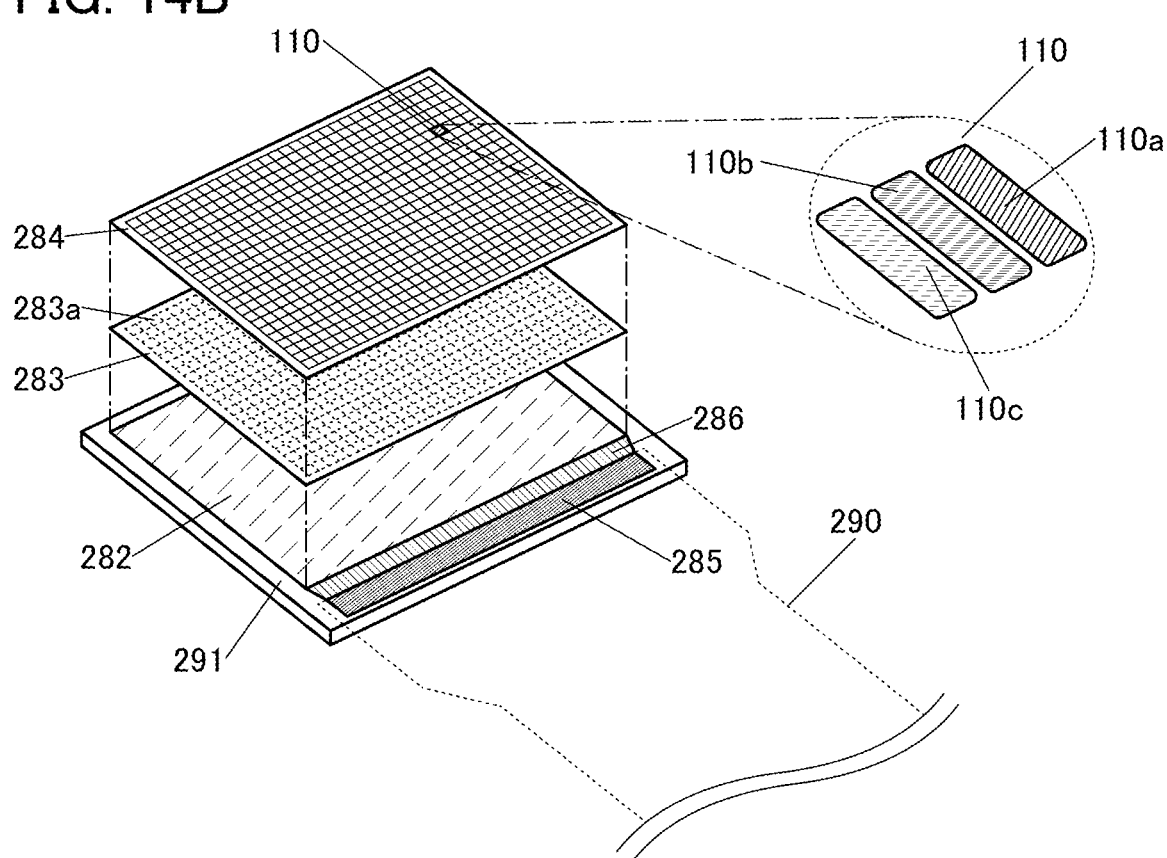

FIG. 14B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion over the substrate 291 that is not overlapped by the pixel portion 284. The terminal portion 285 and the circuit portion 282 are electrically connected to each other through a wiring portion 286 formed of a plurality of wirings.

The pixel portion 284 includes a plurality of pixels 110 arranged periodically. An enlarged view of one pixel 110 is illustrated on the right side of FIG. 14B. The pixel 110 includes the subpixel 110a, the subpixel 110b, and the subpixel 110c. The pixel 110 can include the subpixel 110d. The subpixels can employ stripe arrangement as illustrated in FIG. 14B. Alternatively, a variety of arrangement methods of the subpixels, such as delta arrangement and PenTile arrangement, can be employed.

The pixel circuit portion 283 includes a plurality of pixel circuits 283a arranged periodically.

One pixel circuit 283a is a circuit that controls light emission of three light-emitting elements included in one pixel 110. One pixel circuit 283a may be provided with three circuits each of which controls light emission of one light-emitting element. For example, the pixel circuit 283a can include at least one selection transistor, one current control transistor (driving transistor), and a capacitor for one light-emitting element. In this case, a gate signal is input to a gate of the selection transistor, and a video signal is input to one of a source and a drain of the selection transistor. Thus, an active-matrix display apparatus is achieved.

There is no particular limitation on the crystallinity of a semiconductor material used for the transistors, and any of an amorphous semiconductor and a semiconductor having crystallinity (a microcrystalline semiconductor, a polycrystalline semiconductor, a single crystal semiconductor, or a semiconductor partly including crystal regions) may be used. It is preferable to use a semiconductor having crystallinity, in which case deterioration of the transistor characteristics can be inhibited.

It is preferable that a semiconductor layer of a transistor contain a metal oxide (also referred to as an oxide semiconductor). That is, a transistor including a metal oxide in its channel formation region (hereinafter, also referred to as an OS transistor) is preferably used for the display apparatus of this embodiment. Alternatively, a semiconductor layer of a transistor preferably contains silicon. Examples of silicon include amorphous silicon and crystalline silicon (e.g., low-temperature polysilicon or single crystal silicon).

The semiconductor layer preferably contains indium, M (M is one or more selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more selected from aluminum, gallium, yttrium, and tin.

It is particularly preferable that an oxide containing indium (In), gallium (Ga), and zinc (Zn) (also referred to as IGZO) be used as the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit portion 282 and the transistor included in pixel circuit portion 283 may have the same structure or different structures. One structure or two or more kinds of structures may be employed for a plurality of transistors included in the circuit portion 282. Similarly, one structure or two or more kinds of structures may be employed for a plurality of transistors included in the pixel circuit portion 283.

The circuit portion 282 includes a circuit for driving the pixel circuits 283a in the pixel circuit portion 283. For example, one or both of a gate line driver circuit and a source line driver circuit are preferably included. In addition, at least one of an arithmetic circuit, a memory circuit, a power supply circuit, and the like may be included.

The FPC 290 functions as a wiring for supplying a video signal, a power supply potential, or the like to the circuit portion 282 from the outside. An IC (integrated circuit) may be mounted on the FPC 290.

The display module 280 can have a structure in which one or both of the pixel circuit portion 283 and the circuit portion 282 are stacked below the pixel portion 284; hence, the aperture ratio (effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 110 can be arranged extremely densely and thus the display portion 281 can have extremely high resolution. For example, the pixels 110 are preferably arranged in the display portion 281 with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

Such a display module 280 has extremely high resolution, and thus can be suitably used for a VR device such as a head mounted display or a glasses-type AR device. For example, even with a structure in which the display portion of the display module 280 is seen through a lens, pixels of the extremely-high-resolution display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be favorably used in a display portion of a wearable electronic device, such as a wrist watch.

[Display Apparatus 100A]

Figure 15:
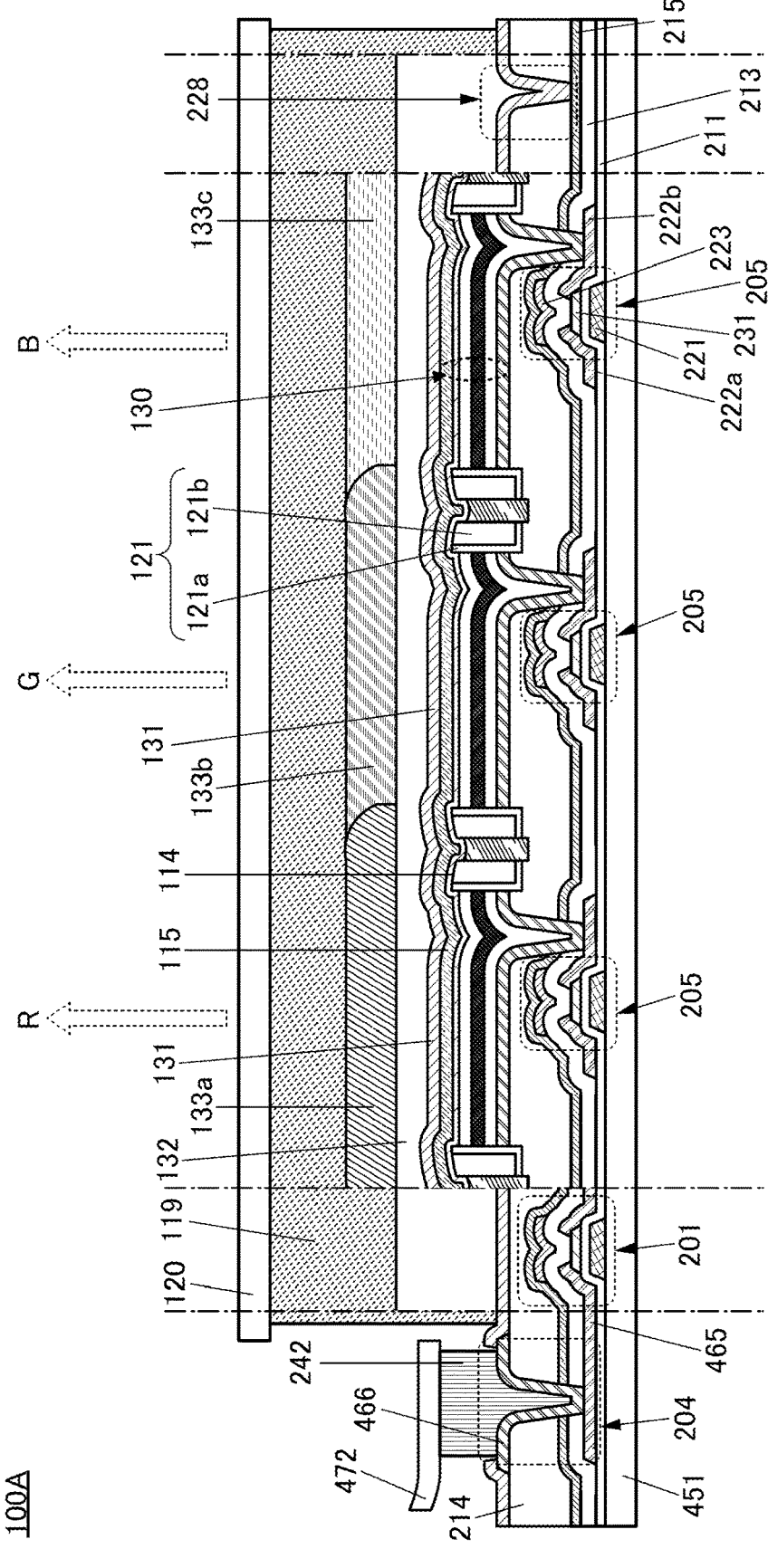
FIG. 15 is a cross-sectional view illustrating a structure example of a display apparatus.

FIG. 15 is a cross-sectional view illustrating a structure example of a display apparatus 100A. The display apparatus 100A illustrated in FIG. 15 includes a transistor 201, a transistor 205, the light-emitting element 130, the coloring layer 133a, the coloring layer 133b, the coloring layer 133c, and the like between a substrate 451 and the substrate 120.

The light-emitting element described in Embodiment 1 as an example can be used as the light-emitting element 130.

The transistor 201 and the transistor 205 are formed over the substrate 451. These transistors can be fabricated using the same material in the same step.

An insulating layer 211, an insulating layer 213, an insulating layer 215, and an insulating layer 214 are provided in this order over the substrate 451. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of a display apparatus.

An inorganic insulating film is preferably used as each of the insulating layers 211, 213, and 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

Here, an organic insulating film often has a lower barrier property than an inorganic insulating film. Therefore, the organic insulating film preferably has an opening in the vicinity of an end portion of the display apparatus 100A. This can inhibit entry of impurities from the end portion of the display apparatus 100A through the organic insulating film. Alternatively, the organic insulating film may be formed so that its end portion is positioned on the inner side compared to the end portion of the display apparatus 100A, to prevent the organic insulating film from being exposed at the end portion of the display apparatus 100A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 15, an opening is formed in the insulating layer 214. This can inhibit entry of impurities into the light-emitting element 130 from the outside through the insulating layer 214 even when an organic insulating film is used as the insulating layer 214. Consequently, the reliability of the display apparatus 100A can be increased.

Each of the transistors 201 and 205 includes a conductive layer 221 functioning as a gate, the insulating layer 211 functioning as a gate insulating layer, a conductive layer 222a and a conductive layer 222b functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, or an inverted staggered transistor can be used. Either of a top-gate transistor structure and a bottom-gate transistor structure can be used. Alternatively, gates may be provided above and below a semiconductor layer where a channel is formed.

The structure in which the semiconductor layer where a channel is formed is provided between two gates is used for the transistors 201 and 205. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. It is preferable to use a semiconductor having crystallinity, in which case deterioration of the transistor characteristics can be inhibited.

It is preferable that a semiconductor layer of a transistor contain a metal oxide. That is, a transistor including a metal oxide in its channel formation region is preferably used for the display apparatus of this embodiment. Alternatively, a semiconductor layer of a transistor may contain silicon. Examples of silicon include amorphous silicon and crystalline silicon (e.g., low-temperature polysilicon or single crystal silicon).

The semiconductor layer preferably contains indium, M (M is one or more selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more selected from aluminum, gallium, yttrium, and tin.

It is particularly preferable that an oxide containing indium (In), gallium (Ga), and zinc (Zn) (also referred to as IGZO) be used as the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

A connection portion 204 is provided in a region of the substrate 451 that does not overlap with the substrate 120. In the connection portion 204, a wiring 465 is electrically connected to an FPC 472 through a conductive layer 466 and a connection layer 242. The conductive layer 466 can be formed in the same step as the pixel electrode. On the top surface of the connection portion 204, the conductive layer 466 is exposed. Thus, the connection portion 204 and the FPC 472 can be electrically connected to each other through the connection layer 242.

A variety of optical members can be arranged on the outer surface of the substrate 120. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, an impact-absorbing layer, or the like may be arranged on the outer surface of the substrate 120.

When the protective layer 131 covering the light-emitting element is provided, which prevents an impurity such as water from entering the light-emitting element. As a result, the reliability of the light-emitting element can be enhanced.

In the region 228 in the vicinity of the end portion of the display apparatus 100A, the insulating layer 215 and the protective layer 131 are preferably in contact with each other through an opening in the insulating layer 214. In particular, the inorganic insulating film included in the insulating layer 215 and the inorganic insulating film included in the protective layer 131 are preferably in contact with each other. This can inhibit entry of impurities into the light-emitting element 130 from the outside through the organic insulating film. Consequently, the reliability of the display apparatus 100A can be increased.

For each of the substrate 451 and the substrate 120, glass, quartz, ceramics, sapphire, a resin, a metal, an alloy, a semiconductor, or the like can be used. The substrate on the side from which light from the light-emitting element is extracted is formed using a material which transmits the light. When the substrate 451 and the substrate 120 are formed using a flexible material, the flexibility of the display apparatus can be increased. Furthermore, a polarizing plate may be used as the substrate 451 or the substrate 120.

For each of the substrate 451 and the substrate 120, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for one or both of the substrate 451 and the substrate 120.

As the adhesive layer, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. An adhesive sheet or the like may be used.

As the connection layer 242, an anisotropic conductive film (ACF), an anisotropic conductive paste (ACP), or the like can be used.

In the display apparatus 100A, the coloring layer 133a, the coloring layer 133b, and the coloring layer 133c are provided between the light-emitting element 130 and the substrate 120. As described above, the transistors are formed over the substrate 451. Accordingly, the display apparatus 100A can be a top-emission display apparatus. Thus, the substrate 451 in the display apparatus 100A can be a substrate that does not have a light-transmitting property.

[Display Apparatus 100B]

Figure 16:
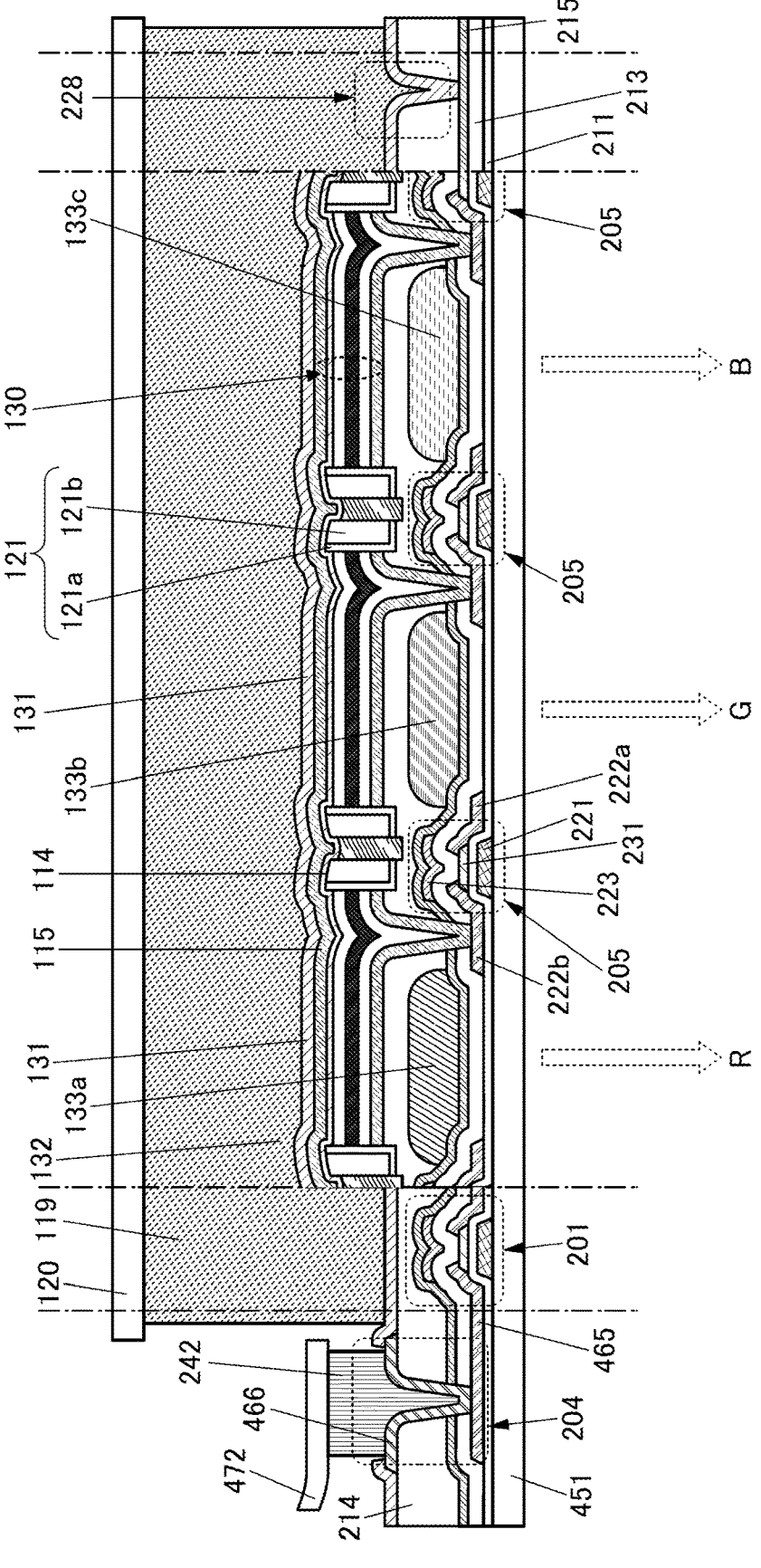
FIG. 16 is a cross-sectional view illustrating a structure example of a display apparatus.

FIG. 16 is a cross-sectional view illustrating a structure example of a display apparatus 100B. The display apparatus 100B is a modification example of the display apparatus 100A and is different from the display apparatus 100A in that the coloring layer 133a, the coloring layer 133b, and the coloring layer 133c are provided between the light-emitting element 130 and the substrate 451. That is, the display apparatus 100B can be a bottom-emission display apparatus. Thus, the substrate 120 in the display apparatus 100B can be a substrate that does not have a light-transmitting property.

[Display Apparatus 100C]

Figure 17:
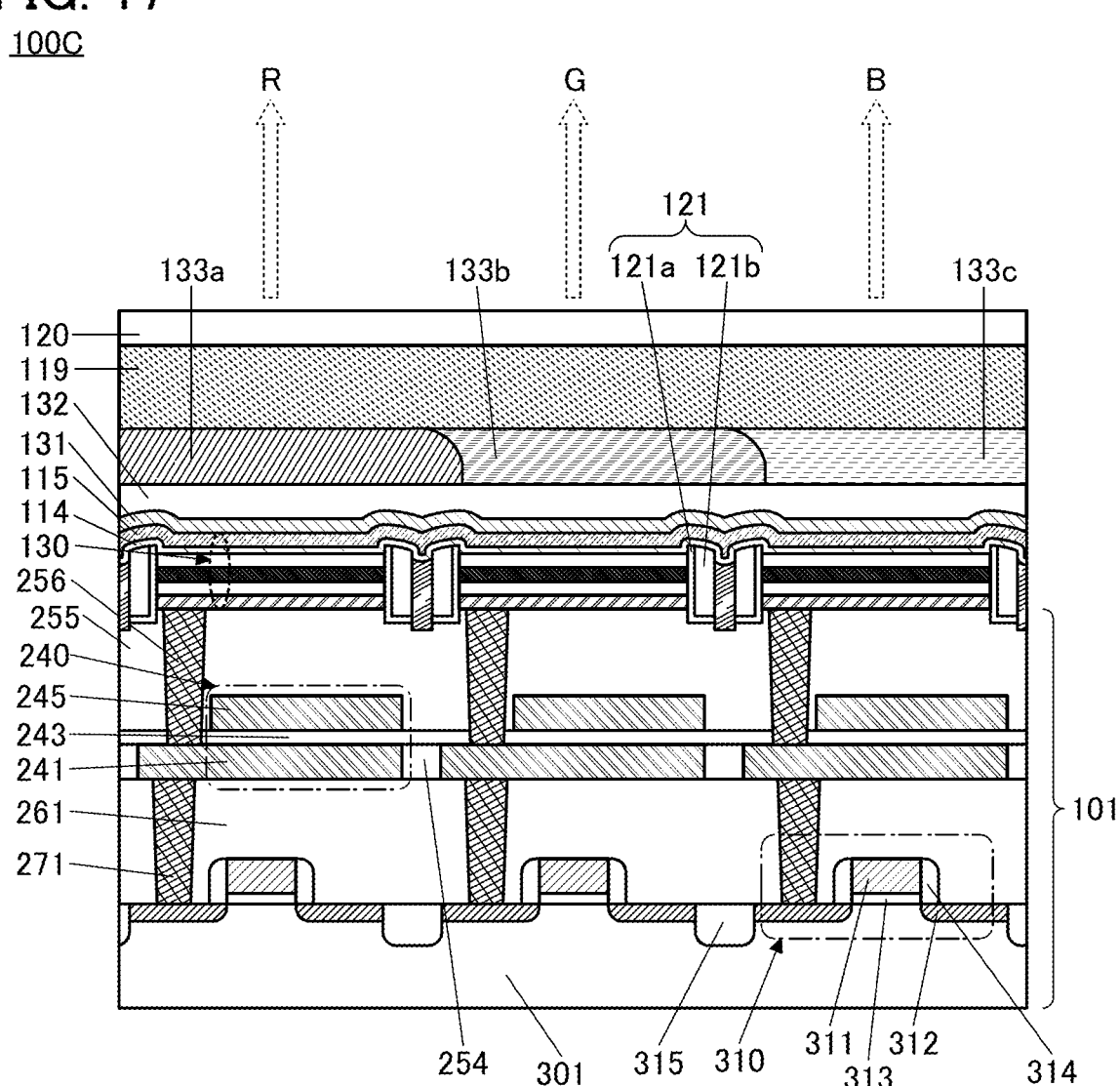
FIG. 17 is a cross-sectional view illustrating a structure example of a display apparatus.

A display apparatus 100C illustrated in FIG. 17 includes a substrate 301, the light-emitting element 130, a capacitor 240, and a transistor 310.

The substrate 301 corresponds to the substrate 291 in FIG. 14A and FIG. 14B. A stacked-layer structure including the substrate 301 and the components thereover up to an insulating layer 255 corresponds to the layer 101 including transistors in Embodiment 1.

The transistor 310 includes a channel formation region in the substrate 301. As the substrate 301, a semiconductor substrate such as a single crystal silicon substrate can be used, for example. The transistor 310 includes part of the substrate 301, a conductive layer 311, a low-resistance region 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as a source or a drain. The insulating layer 314 is provided to cover a side surface of the conductive layer 311.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 therebetween. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping the conductive layer 241 with the insulating layer 243 therebetween.

The insulating layer 255 is provided to cover the capacitor 240, and the light-emitting elements 130 and the like are provided over the insulating layer 255. The protective layer 131 is provided over each of the light-emitting elements 130. The protective layer 132 is provided over the protective layer 131, and the substrate 120 is bonded onto the protective layer 132 with the resin layer 119. Embodiment 1 can be referred to for details of the light-emitting elements and the components thereover up to the substrate 120. The substrate 120 corresponds to the substrate 292 in FIG. 14A.

The pixel electrode of the light-emitting element is electrically connected to one of the source and the drain of the transistor 310 through a plug 256 embedded in the insulating layer 255 and the insulating layer 243, the conductive layer 241 embedded in the insulating layer 254, and the plug 271 embedded in the insulating layer 261.

[Display Apparatus 100D]

Figure 18:
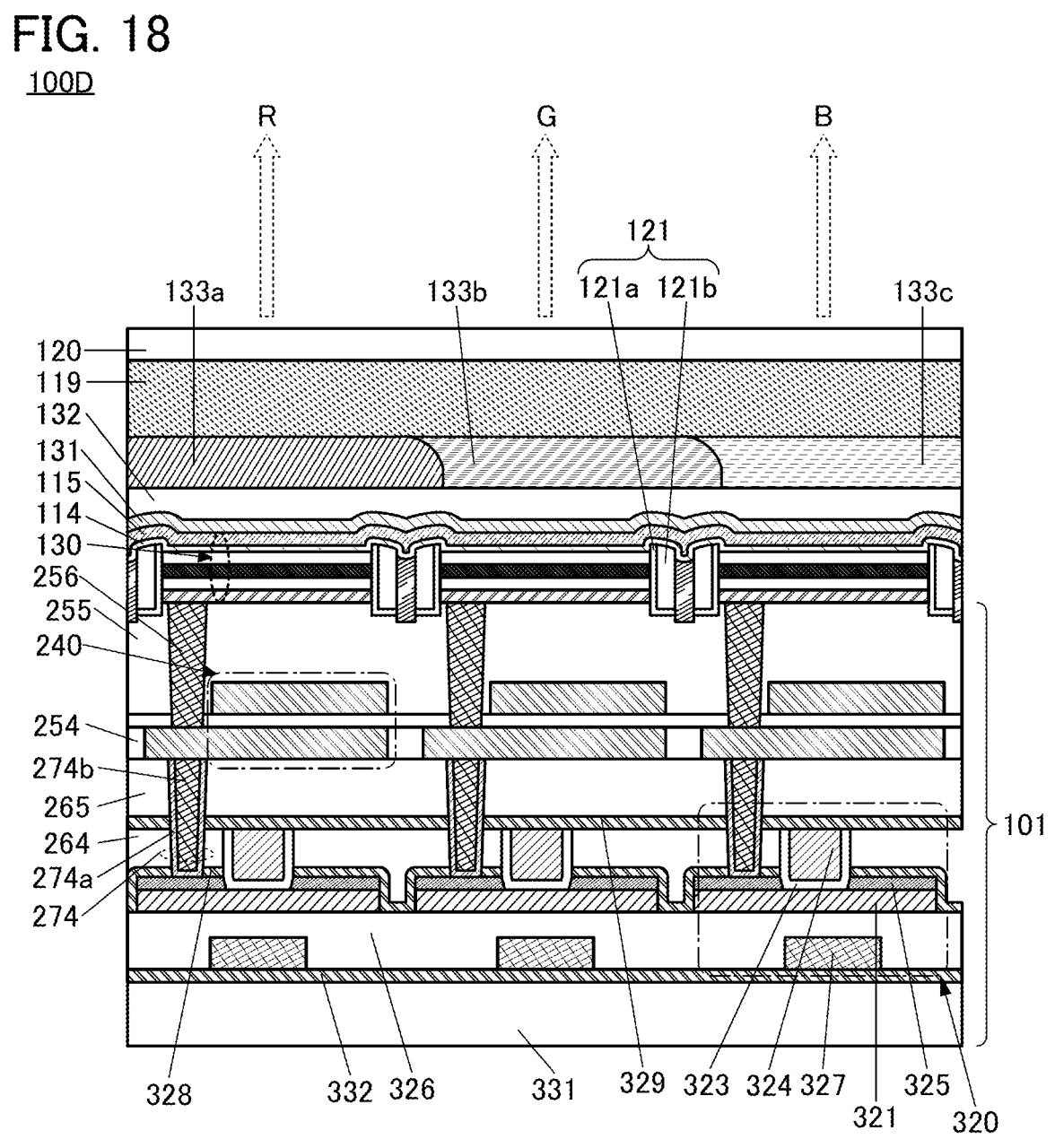

The display apparatus 100D illustrated in FIG. 18 differs from the display apparatus 100C mainly in a structure of a transistor. Note that portions similar to those in the display apparatus 100C are not described in some cases.

A transistor 320 is a transistor that contains a metal oxide in a semiconductor layer where a channel is formed (OS transistor).

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 14A and FIG. 14B. A stacked-layer structure including the substrate 331 and the components thereover up to the insulating layer 255 corresponds to the layer 101 including transistors in Embodiment 1. As the substrate 331, an insulating substrate or a semiconductor substrate can be used.

An insulating layer 332 is provided over the substrate 331. The insulating layer 332 functions as a barrier layer that prevents diffusion of impurities such as water or hydrogen from the substrate 331 into the transistor 320 and release of oxygen from the semiconductor layer 321 to the insulating layer 332 side. As the insulating layer 332, for example, a film in which hydrogen or oxygen is less likely to diffuse than in a silicon oxide film, such as an aluminum oxide film, a hafnium oxide film, or a silicon nitride film, can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. A metal oxide film having semiconductor characteristics is preferably used as the semiconductor layer 321. The pair of conductive layers 325 are provided on and in contact with the semiconductor layer 321 and function as a source electrode and a drain electrode.

An insulating layer 328 is provided to cover top and side surfaces of the pair of conductive layers 325, a side surface of the semiconductor layer 321, and the like, and an insulating layer 264 is provided over the insulating layer 328. The insulating layer 328 functions as a barrier layer that prevents diffusion of impurities such as water or hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with side surfaces of the insulating layer 264, the insulating layer 328, and the conductive layer 325 and the top surface of the semiconductor layer 321, and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are planarized so that they are substantially level with each other, and an insulating layer 329 and an insulating layer 265 are provided to cover these layers.

The insulating layer 264 and the insulating layer 265 each function as an interlayer insulating layer. The insulating layer 329 functions as a barrier layer that prevents diffusion of impurities such as water or hydrogen from the insulating layer 265 or the like into the transistor 320. As the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, the insulating layer 264, and the insulating layer 328. Here, the plug 274 preferably includes a conductive layer 274a that covers a side surface of an opening formed in the insulating layer 265, the insulating layer 329, the insulating layer 264, and the insulating layer 328 and part of the top surface of the conductive layer 325, and a conductive layer 274b in contact with the top surface of the conductive layer 274a. For the conductive layer 274a, a conductive material in which hydrogen and oxygen are less likely to diffuse is preferably used.

Besides, the layer 101 including a transistor may include any of a variety of inorganic insulating films. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

The structures of the insulating layer 254 and the components thereover up to the substrate 120 in the display apparatus 100D are similar to those in the display apparatus 100C.

[Display Apparatus 100E]

Figure 19:
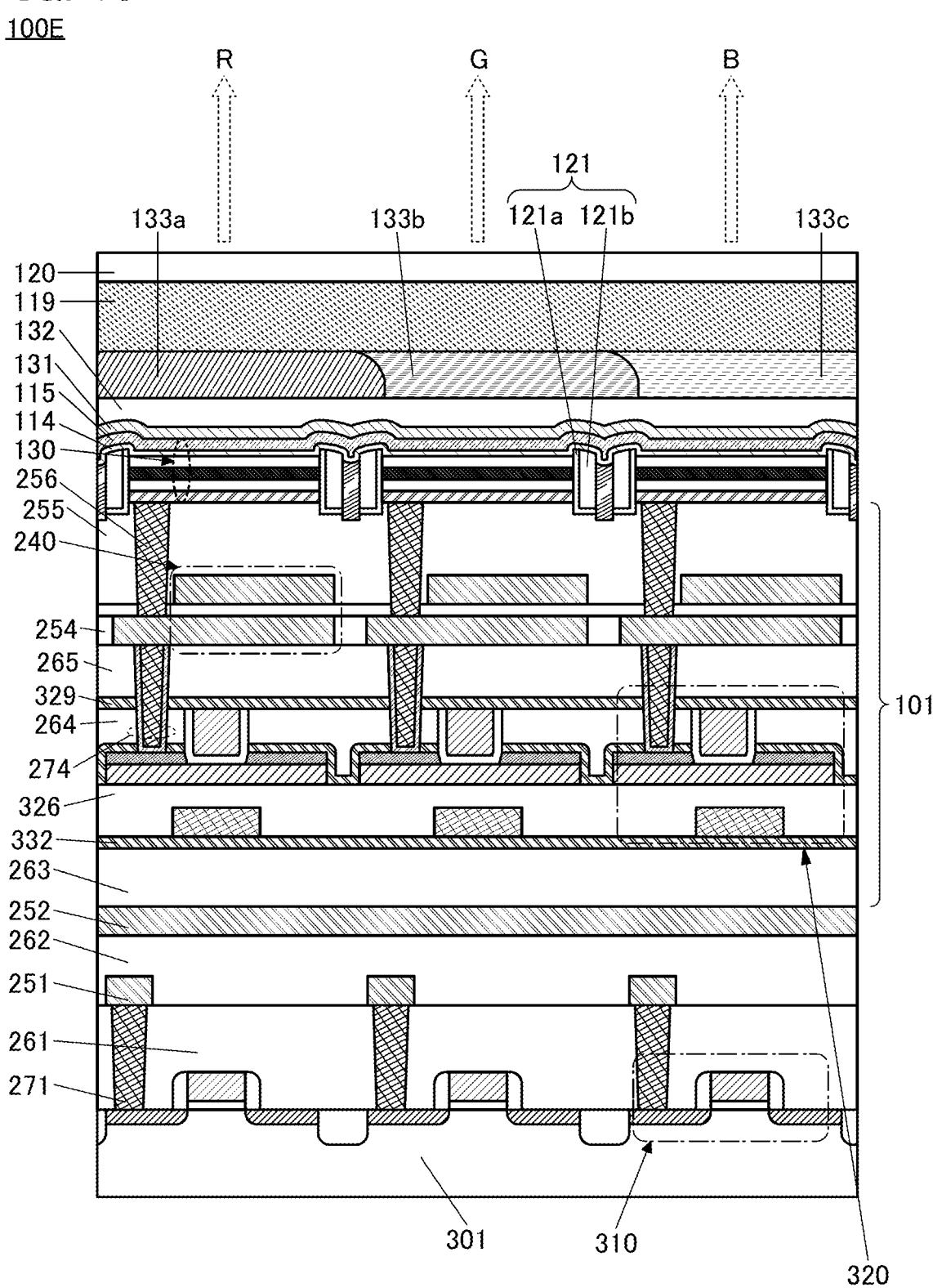
FIG. 19 is a cross-sectional view illustrating a structure example of a display apparatus.

The display apparatus 100E illustrated in FIG. 19 has a structure in which the transistor 310 whose channel is formed in the substrate 301 and the transistor 320 including a metal oxide in the semiconductor layer where the channel is formed are stacked. Note that portions similar to those in the display apparatus 100C and the display apparatus 100D are not described in some cases.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit for driving the pixel circuit (a gate line driver circuit or a source line driver circuit). The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting elements; thus, the display apparatus can be downsized as compared with the case where a driver circuit is provided around a display region.

This embodiment can be combined with the other embodiments as appropriate.

Embodiment 3

In this embodiment, a metal oxide that can be used in the OS transistor described in the above embodiment will be described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a CVD method such as an MOCVD method, an ALD method, or the like.

<Classification of Crystal Structure>

Amorphous (including completely amorphous), CAAC (c-axis-aligned crystalline), nc (nanocrystalline), CAC (cloud-aligned composite), single-crystal, and polycrystalline (polycrystal) structures can be given as examples of a crystal structure of an oxide semiconductor. Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method.

For example, the XRD spectrum of the quartz glass substrate shows a peak with a substantially bilaterally symmetrical shape. On the other hand, the peak of the XRD spectrum of the IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film formed at room temperature. Thus, it is suggested that the IGZO film formed at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by Out-of-plane XRD measurement with an XRD apparatus using $\theta/2\theta$ scanning, for example, a peak indicating c-axis alignment is detected at $2\theta$ of 31° or around 31°. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using $\theta/2\theta$ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[A-Like OS]

The a-like OS is an oxide semiconductor having a structure between those of the nc-OS and the amorphous oxide semiconductor. The a-like OS contains a void or a low-density region. That is, the a-like OS has lower crystallinity than the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The ratio of the flow rate of an oxygen gas to the total flow rate of the deposition gas at the time of deposition is preferably as low as possible, and for example, the ratio of the flow rate of an oxygen gas to the total flow rate of the deposition gas at the time of deposition is preferably higher than or equal to 0% and less than 30%, further preferably higher than or equal to 0% and less than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility ($\mu$) can be achieved.

The second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

A transistor using the CAC-OS has high reliability. Thus, the CAC-OS is most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1\times10^{-9}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, trap states are sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given. This embodiment can be combined with the other embodiments as appropriate.

Embodiment 4

In this embodiment, electronic devices of one embodiment of the present invention will be described with reference to FIG. 20 to FIG. 24.

An electronic device of this embodiment is provided with the display apparatus of one embodiment of the present invention in a display portion. The display apparatus of one embodiment of the present invention can be easily increased in resolution and definition. Thus, the display apparatus of one embodiment of the present invention can be used for a display portion of a variety of electronic devices.

Examples of electronic devices include a digital camera, a digital video camera, a digital photo frame, a mobile phone, a portable game console, a portable information terminal, and an audio reproducing device in addition to electronic devices with a relatively large screen, such as a television device, a desktop or notebook personal computer, a monitor of a computer or the like, digital signage, and a large game machine like a pachinko machine.

In particular, a display apparatus of one embodiment of the present invention can have a high resolution, and thus can be favorably used for an electronic device having a relatively small display portion. Examples of such an electronic device include a watch-type or a bracelet-type information terminal device (wearable device), and a wearable device worn on a head, such as a device for VR such as a head mounted display, a glasses-type device for AR, and a device for MR.

The definition of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, the definition is preferably 4K, 8K, or higher. Furthermore, the pixel density (resolution) of the display apparatus of one embodiment of the present invention is preferably higher than or equal to 100 ppi, higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, and yet further preferably higher than or equal to 7000 ppi. With the use of such a display apparatus with high definition and high resolution, the electronic device can have higher realistic sensation, sense of depth, and the like in personal use such as portable use and home use. There is no particular limitation on the screen ratio (aspect ratio) of the display apparatus of one embodiment of the present invention. For example, the display apparatus is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of head-mounted wearable devices are described with reference to FIG. 20A, FIG. 20B, FIG. 21A, and FIG. 21B. These wearable devices have one or both of a function of displaying AR contents and a function of displaying VR contents. Note that these wearable devices may have a function of displaying SR or MR contents, in addition to AR and VR contents. The electronic device having a function of displaying contents of AR, VR, SR, MR, or the like enables the user to reach a higher level of immersion.

An electronic device 700A illustrated in FIG. 20A and an electronic device 700B illustrated in FIG. 20B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display apparatus of one embodiment of the present invention can be used for the display panel 751. Thus, the electronic device can perform display with extremely high resolution.

The electronic device 700A and the electronic device 700B can each project an image displayed on the display panel 751 onto display regions 756 of the optical members 753. Since the optical members 753 have a light-transmitting property, a user can see images displayed on the display regions 756, which are superimposed on transmission images seen through the optical members 753. Accordingly, the electronic device 700A and the electronic device 700B are electronic devices capable of AR display.

In the electronic device 700A and the electronic device 700B, a camera capable of capturing images of the front side may be provided as the image capturing portion. Furthermore, when the electronic device 700A and the electronic device 700B are provided with an acceleration sensor such as a gyroscope sensor, the orientation of the user's head can be detected and an image corresponding to the orientation can be displayed on the display region 756.

The communication portion includes a wireless communication device, and a video signal and the like can be supplied by the wireless communication device. Note that instead of or in addition to the wireless communication device, a connector to which a cable for supplying a video signal and/or a power supply potential can be connected may be provided.

The electronic device 700A and the electronic device 700B are provided with a battery so that they can be charged wirelessly and/or by wire.

A touch sensor module may be provided in the housing 721. The touch sensor module has a function of detecting a touch on the outer surface of the housing 721. A tap operation or a slide operation, for example, by the user can be detected with the touch sensor module, whereby a variety of processing can be executed. For example, processing such as a pause or a restart of a moving image can be executed by a tap operation, and processing such as fast forward and fast rewind can be executed by a slide operation. The touch sensor module is provided in each of the two housings 721, whereby the range of the operation can be increased.

A variety of touch sensors can be applied to the touch sensor module. Any of touch sensors of various types such as a capacitive type, a resistive type, an infrared type, an electromagnetic induction type, a surface acoustic wave type, and an optical type can be employed. In particular, a capacitive sensor or an optical sensor is preferably used for the touch sensor module.

In the case of using an optical touch sensor, a photoelectric conversion device (also referred to as a photoelectric conversion element) can be used as a light-receiving device (also referred to as a light-receiving element). One or both of an inorganic semiconductor and an organic semiconductor can be used for an active layer of the photoelectric conversion device.

An electronic device 800A illustrated in FIG. 21A and an electronic device 800B illustrated in FIG. 21B each include a pair of display portions 820, a housing 821, a communication portion 822, a pair of wearing portions 823, a control portion 824, a pair of image capturing portions 825, and a pair of lenses 832.

A display apparatus of one embodiment of the present invention can be used in the display portions 820. Thus, the electronic device can perform display with extremely high resolution. This enables a user to feel high sense of immersion.

The display portions 820 are positioned inside the housing 821 so as to be seen through the lenses 832. When the pair of display portions 820 display different images, three-dimensional display using parallax can be performed.

The electronic device 800A and the electronic device 800B can be regarded as electronic devices for VR. The user who wears the electronic device 800A or the electronic device 800B can see images displayed on the display portions 820 through the lenses 832.

The electronic device 800A and the electronic device 800B preferably include a mechanism for adjusting the lateral positions of the lenses 832 and the display portions 820 so that the lenses 832 and the display portions 820 are positioned optimally in accordance with the positions of the user's eyes. Moreover, a mechanism for adjusting focus by changing the distance between the lenses 832 and the display portions 820 is preferably included.

The electronic device 800A or the electronic device 800B can be mounted on the user's head with the wearing portions 823. FIG. 21A or the like illustrates an example in which wearing portion 823 has a shape like a temple (also referred to as a joint or the like) of glasses; however, one embodiment of the present invention is not limited thereto. The wearing portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to support a plurality of fields of view, such as a telescope field of view and a wide field of view.

Although an example of including the image capturing portion 825 is described here, a range sensor (hereinafter, also referred to as a sensing portion) that is capable of measuring a distance from an object may be provided. That is, the image capturing portion 825 is one embodiment of the sensing portion. As the sensing portion, an image sensor or a distance image sensor such as LIDAR (Light Detection and Ranging) can be used, for example. With the use of images obtained by the camera and images obtained by the distance image sensor, more pieces of information can be obtained and a gesture operation with higher accuracy is possible.

The electronic device 800A may include a vibration mechanism that functions as bone-conduction earphones. For example, a structure including the vibration mechanism can be applied to any one or more of the display portion 820, the housing 821, and the wearing portion 823. Thus, without additionally requiring an audio device such as headphones, earphones, or a speaker, the user can enjoy video and sound only by wearing the electronic device 800A.

The electronic device 800A and the electronic device 800B may each include an input terminal. To the input terminal, a cable for supplying a video signal from a video output device or the like, electric power for charging a battery provided in the electronic device, and the like can be connected.

The electronic device of one embodiment of the present invention may have a function of performing wireless communication with earphones 750. The earphones 750 include a communication portion (not illustrated) and have a wireless communication function. The earphones 750 can receive information (e.g., audio data) from the electronic device with the wireless communication function. For example, the electronic device 700A illustrated in FIG. 20A has a function of transmitting information to the earphones 750 with the wireless communication function. As another example, the electronic device 800A illustrated in FIG. 21A has a function of transmitting information to the earphones 750 with the wireless communication function.

The electronic device may include an earphone portion. The electronic device 700B illustrated in FIG. 20B includes earphone portions 727. For example, a structure in which the earphone portions 727 and the control portion are connected to each other by wire may be employed. Part of a wiring that connects the earphone portions 727 and the control portion may be positioned inside the housing 721 or the wearing portion 723.

Similarly, the electronic device 800B illustrated in FIG. 21B includes earphone portions 827. For example, a structure in which the earphone portions 827 and the control portion 824 are connected to each other by wire may be employed. Part of a wiring that connects the earphone portions 827 and the control portion 824 may be positioned inside the housing 821 or the wearing portion 823. The earphone portions 827 and the wearing portion 823 may include magnets. This is preferable because the earphone portions 827 can be fixed to the wearing portion 823 with magnetic force and thus can be easily housed.

Note that the electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of a headset by including the audio input mechanism.

As described above, both the glasses-type device (e.g., the electronic device 700A and the electronic device 700B) and the goggles-type device (e.g., the electronic device 800A and the electronic device 800B) are preferable as the electronic device of one embodiment of the present invention.

The electronic device of one embodiment of the present invention can transmit information to earphones by wire or wirelessly.

Figure 22A:
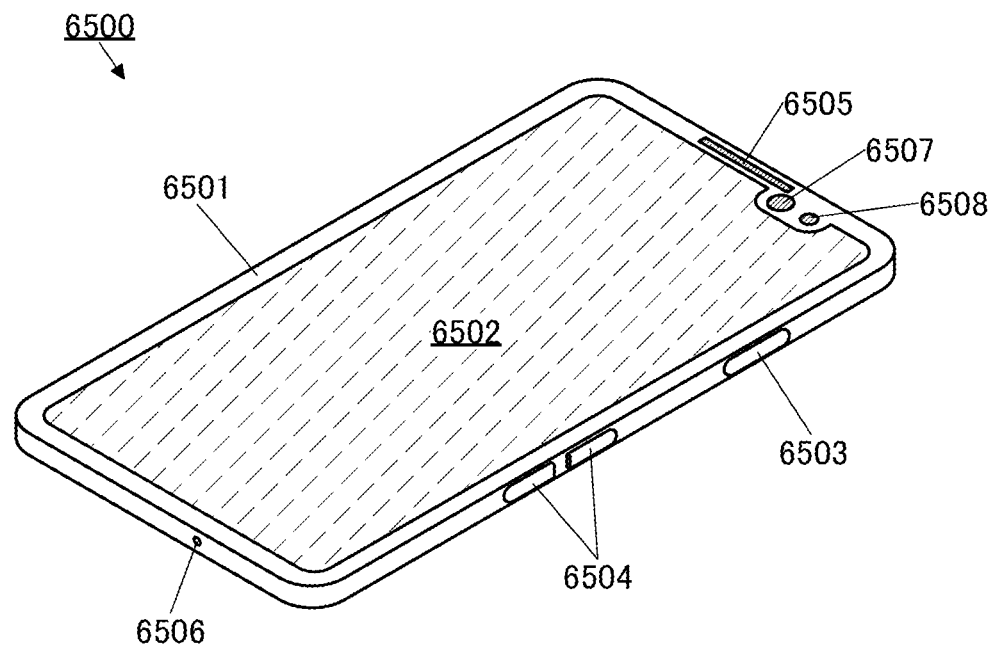
FIG. 22A and FIG. 22B are diagrams illustrating an example of an electronic device.

An electronic device 6500 illustrated in FIG. 22A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in for the display portion 6502.

Figure 22B:
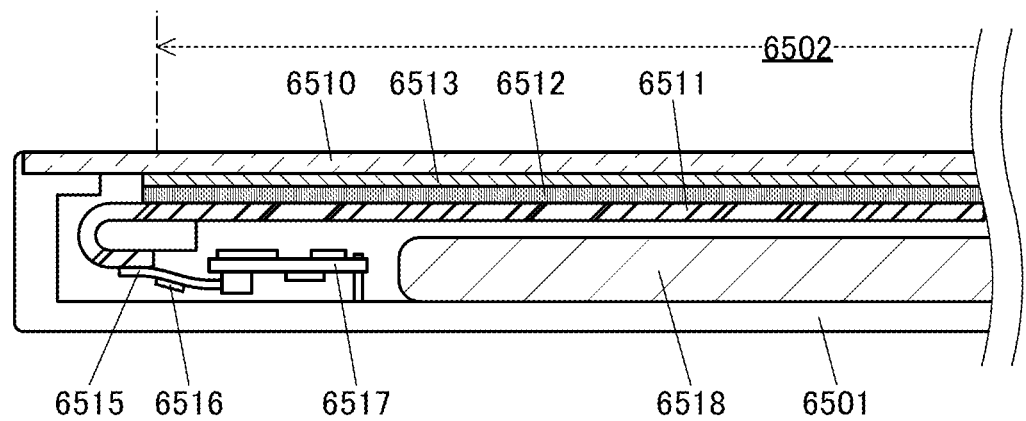

FIG. 22B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted while the thickness of the electronic device is reduced. Moreover, part of the display panel 6511 is folded back so that a connection portion with the FPC 6515 is provided on the back side of the pixel portion, whereby an electronic device with a narrow bezel can be achieved.

FIG. 23A illustrates an example of a television device. In a television device 7100, a display portion 7000 is incorporated in a housing 7101. Here, the housing 7101 is supported by a stand 7103.

The display apparatus of one embodiment of the present invention can be used for the display portion 7000.

Operation of the television device 7100 illustrated in FIG. 23A can be performed with an operation switch provided in the housing 7101 and a separate remote controller 7111. Alternatively, the display portion 7000 may include a touch sensor, and the television device 7100 may be operated by touch on the display portion 7000 with a finger or the like.

The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

FIG. 23B illustrates an example of a notebook personal computer. A notebook personal computer 7200 includes a housing 7211, a keyboard 7212, a pointing device 7213, an external connection port 7214, and the like. In the housing 7211, the display portion 7000 is incorporated.

The display apparatus of one embodiment of the present invention can be used for the display portion 7000.

FIG. 23C and FIG. 23D illustrate examples of digital signage.

Digital signage 7300 illustrated in FIG. 23C includes a housing 7301, the display portion 7000, a speaker 7303, and the like. Furthermore, an LED lamp, an operation key (including a power switch or an operation switch), a connection terminal, a variety of sensors, a microphone, and the like can be included.

FIG. 23D is digital signage 7400 attached to a cylindrical pillar 7401. The digital signage 7400 includes the display portion 7000 provided along a curved surface of the pillar 7401.

The display apparatus of one embodiment of the present invention can be used for the display portion 7000 in FIG. 23C and FIG. 23D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 23C and FIG. 23D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 24A to FIG. 24F each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 24A to FIG. 24F have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The electronic devices illustrated in FIG. 24A to FIG. 24F are described in detail below.

FIG. 24A is a perspective view showing a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 24A illustrates an example in which three icons 9050 are displayed. Furthermore, information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the radio field intensity. Alternatively, the icon 9050 or the like may be displayed at the position where the information 9051 is displayed.

FIG. 24B is a perspective view showing a portable information terminal 9102. The portable information terminal 9102 has a function of displaying information on three or more surfaces of the display portion 9001. Shown here is an example in which information 9052, information 9053, and information 9054 are displayed on different surfaces. For example, a user can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

FIG. 24C is a perspective view illustrating a watch-type portable information terminal 9200. For example, the portable information terminal 9200 can be used as a Smartwatch (registered trademark). The display surface of the display portion 9001 is curved, and an image can be displayed on the curved display surface. Furthermore, intercommunication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

FIG. 24D to FIG. 24F are perspective views illustrating a foldable portable information terminal 9201. FIG. 24D is a perspective view of an opened state of the portable information terminal 9201, FIG. 24F is a perspective view of a folded state thereof, and FIG. 24E is a perspective view of a state in the middle of change from one of FIG. 24D and FIG. 24F to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature of greater than or equal to 0.1 mm and less than or equal to 150 mm, for example.

This embodiment can be combined with the other embodiments as appropriate.

REFERENCE NUMERALS

100: display apparatus, 100A: display apparatus, 100B: display apparatus, 100C: display apparatus, 100D: display apparatus, 100E: display apparatus, 101: layer, 103a: layer, 103b: layer, 110: pixel, 110a: subpixel, 110b: subpixel, 110c: subpixel, 110d: subpixel, 111: pixel electrode, 111A: conductive film, 111C: connection electrode, 112: light-emitting unit, 112_1: light-emitting unit, 112_1A: layer, 112_2: light-emitting unit, 112_2A: layer, 112_3: light-emitting unit, 113: intermediate layer, 113_1: intermediate layer, 113_2: intermediate layer, 113A: intermediate film, 114: common layer, 114a: layer, 115: common electrode, 119: resin layer, 120: substrate, 121: sidewall, 121a: sidewall, 121A: insulating film, 121b: sidewall, 121B: insulating film, 125a: pixel, 125b: pixel, 130: light-emitting element, 131: protective layer, 132: protective layer, 133: coloring layer, 133a: coloring layer, 133b: coloring layer, 133c: coloring layer, 134: gap, 140: connection portion, 141: sacrificial film, 143: protective film, 145: resist mask, 147: sacrificial layer, 149: protective layer, 181: layer, 182: layer, 183: light-emitting layer, 183_1: light-emitting layer, 183_2: light-emitting layer, 183_3: light-emitting layer, 184: layer, 201: transistor, 204: connection portion, 205: transistor, 211: insulating layer, 213: insulating layer, 214: insulating layer, 215: insulating layer, 221: conductive layer, 222a: conductive layer, 222b: conductive layer, 223: conductive layer, 228: region, 231: semiconductor layer, 240: capacitor, 241: conductive layer, 242: connection layer, 243: insulating layer, 245: conductive layer, 251: conductive layer, 252: conductive layer, 254: insulating layer, 255: insulating layer, 256: plug, 261: insulating layer, 262: insulating layer, 263: insulating layer, 264: insulating layer, 265: insulating layer, 271: plug, 274: plug, 274a: conductive layer, 274b: conductive layer, 280: display module, 281: display portion, 282: circuit portion, 283: pixel circuit portion, 283a: pixel circuit, 284: pixel portion, 285: terminal portion, 286: wiring portion, 290: FPC, 291: substrate, 292: substrate, 301: substrate, 310: transistor,

311: conductive layer, 312: low-resistance region, 313: insulating layer, 314: insulating layer, 315: element isolation layer, 320: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 451: substrate, 465: wiring, 466: conductive layer, 472: FPC, 700A: electronic device, 700B: electronic device, 721: housing, 723: wearing portion, 727: earphone portion, 750: earphone, 751: display panel, 753: optical member, 756: display region, 757: frame, 758: nose pad, 800A: electronic device, 800B: electronic device, 820: display portion, 821: housing, 822: communication portion, 823: wearing portion, 824: control portion, 825: image capturing portion, 827: earphone portion, 832: lens, 6500: electronic device, 6501: housing, 6502: display portion, 6503: power supply button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: notebook personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A display apparatus comprising:
a first light-emitting element;
a second light-emitting element;
a first sidewall;
a second sidewall;
a third sidewall; and
a fourth sidewall,
wherein the first light-emitting element comprises:
    a first pixel electrode;
    a first light-emitting layer over the first pixel electrode;
    a first intermediate layer over the first light-emitting layer;
    a second light-emitting layer over the first intermediate layer; and
    a common electrode over the second light-emitting layer,
wherein the second light-emitting element comprises:
    a second pixel electrode;
    a third light-emitting layer over the second pixel electrode;
    a second intermediate layer over the third light-emitting layer;
    a fourth light-emitting layer over the second intermediate layer; and
    the common electrode over the fourth light-emitting layer,
wherein the first light-emitting element and the second light-emitting element are adjacent to each other, wherein the first sidewall covers at least part of a side surface of the first pixel electrode, part of a side surface of the first light-emitting layer and part of a side surface of the second light-emitting layer, and part of a side surface of the first intermediate layer, wherein the second sidewall covers at least part of a side surface of the first sidewall, wherein the third sidewall covers at least part of a side surface of the second pixel electrode, part of a side surface of the third light-emitting layer and part of a side surface of the fourth light-emitting layer, and part of a side surface of the second intermediate layer, wherein the fourth sidewall covers at least part of a side surface of the third sidewall, wherein the second sidewall covers at least part of a top surface of the first sidewall, and wherein the fourth sidewall covers at least part of a top surface of the third sidewall.

2. The display apparatus according to claim 1, further comprising a gap between the second sidewall and the fourth sidewall.

3. A fabrication method of a display apparatus, comprising the steps of:

forming an insulating layer;

forming a conductive film, a first light-emitting film, an intermediate film, a second light-emitting film, and a sacrificial film in this order over the insulating layer;

etching the sacrificial film, the second light-emitting film, the intermediate film, the first light-emitting film, and the conductive film to form a first pixel electrode and a second pixel electrode over the insulating layer, a first light-emitting layer over the first pixel electrode, a second light-emitting layer over the second pixel electrode, a first intermediate layer over the first light-emitting layer, a second intermediate layer over the second light-emitting layer, a third light-emitting layer over the first intermediate layer, a fourth light-emitting layer over the second intermediate layer, a first sacrificial layer over the third light-emitting layer, and a second sacrificial layer over the fourth light-emitting layer;

forming an insulating film covering at least part of a side surface of the first pixel electrode and part of a side surface of the second pixel electrode, part of a side surface of the first light-emitting layer, part of a side surface of the second light-emitting layer, part of a side surface of the third light-emitting layer, and part of a side surface of the fourth light-emitting layer, part of a side surface of the first intermediate layer and part of a side surface of the second intermediate layer, and part of a side surface and a top surface of the first sacrificial layer and part of a side surface and a top surface of the second sacrificial layer;

etching the insulating film to form a first sidewall covering at least part of the side surface of the first pixel electrode and a second sidewall covering at least part of the side surface of the second pixel electrode;

removing the first sacrificial layer and the second sacrificial layer; and forming a common electrode over the third light-emitting layer and over the fourth light-emitting layer.

4. A fabrication method of a display apparatus, comprising the steps of:

forming an insulating layer;

forming a conductive film, a first light-emitting film, an intermediate film, a second light-emitting film, and a sacrificial film in this order over the insulating layer;

etching the sacrificial film, the second light-emitting film, the intermediate film, the first light-emitting film, and the conductive film to form a first pixel electrode and a second pixel electrode over the insulating layer, a first light-emitting layer over the first pixel electrode, a second light-emitting layer over the second pixel electrode, a first intermediate layer over the first light-emitting layer, a second intermediate layer over the second light-emitting layer, a third light-emitting layer over the first intermediate layer, a fourth light-emitting layer over the second intermediate layer, a first sacrificial layer over the third light-emitting layer, and a second sacrificial layer over the fourth light-emitting layer;

forming a first insulating film covering at least part of a side surface of the first pixel electrode and part of a side surface of the second pixel electrode, part of a side surface of the first light-emitting layer, part of a side surface of the second light-emitting layer, part of a side surface of the third light-emitting layer, and part of a side surface of the fourth light-emitting layer, part of a side surface of the first intermediate layer and part of a side surface of the second intermediate layer, and part of a side surface and a top surface of the first sacrificial layer and part of a side surface and a top surface of the second sacrificial layer;

forming a second insulating film over the first insulating film;

etching the first insulating film and the second insulating film to form a first sidewall covering at least part of the side surface of the first pixel electrode, a second sidewall covering at least part of the side surface of the second pixel electrode, a third sidewall covering at least part of a side surface of the first sidewall, and a fourth sidewall covering at least part of a side surface of the second sidewall;

removing the first sacrificial layer and the second sacrificial layer; and forming a common electrode over the third light-emitting layer and over the fourth light-emitting layer.

5. The fabrication method of a display apparatus, according to claim 3, wherein the conductive film is etched using the first sacrificial layer and the second sacrificial layer as a mask.

6. The fabrication method of a display apparatus, according to claim 3, further comprising the steps of:

forming a protective layer over the common electrode; and forming a first coloring layer comprising a region overlapping with the first light-emitting layer and the third light-emitting layer and a second coloring layer comprising a region overlapping with the second light-emitting layer and the fourth light-emitting layer over the protective layer, wherein the first coloring layer and the second coloring layer are configured to transmit light of different colors.

7. The fabrication method of a display apparatus, according to claim 3, wherein after the first sacrificial layer and the second sacrificial layer are removed, a common layer configured to function as one of an electron-injection layer and a hole-injection layer is formed over the third light-emitting layer and over the fourth light-emitting layer, and wherein the common electrode is formed over the common layer.

8. The fabrication method of a display apparatus, according to claim 3, wherein a depression is formed in the insulating layer in the etching of the conductive film.

9. The display apparatus according to claim 1, further comprising:

a protective layer over the common electrode;

a first coloring layer over the protective layer so as to comprise a region overlapping with the first light-emitting layer and the second light-emitting layer; and a second coloring layer over the protective layer so as to comprise a region overlapping with the third light-emitting layer and the fourth light-emitting layer, wherein the first coloring layer and the second coloring layer are configured to transmit light of different colors, wherein the first light-emitting layer and the third light-emitting layer are configured to emit light of the same color, and wherein the second light-emitting layer and the fourth light-emitting layer are configured to emit light of the same color.

10. The display apparatus according to claim 1, further comprising a common layer between the common electrode and each of the second light-emitting layer and the fourth light-emitting layer, wherein the common layer is configured to function as one of an electron-injection layer and a hole-injection layer in the first light-emitting element and the second light-emitting element.

11. The display apparatus according to claim 1, wherein the first pixel electrode and the second pixel electrode are provided over an insulating layer, wherein the insulating layer comprises a first projection in a region overlapping with the first pixel electrode, and wherein the insulating layer comprises a second projection in a region overlapping with the second pixel electrode.

12. A display module comprising:

the display apparatus according to claim 1; and at least one of a connector and an integrated circuit.

\* \* \* \* \*